US007087952B2

(12) United States Patent
Zhu et al.

(10) Patent No.: US 7,087,952 B2
(45) Date of Patent: Aug. 8, 2006

(54) DUAL FUNCTION FINFET, FINMEMORY AND METHOD OF MANUFACTURE

(75) Inventors: Huilong Zhu, Poughkeepsie, NY (US); Bruce B. Doris, Brewster, NY (US); Jochen Beintner, Reutlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/978,951

(22) Filed: Nov. 1, 2004

(65) Prior Publication Data

US 2006/0091450 A1 May 4, 2006

(51) Int. Cl.
*H01L 29/788* (2006.01)

(52) U.S. Cl. ...................... 257/315; 257/316; 257/347; 257/E29.3; 257/E27.112

(58) Field of Classification Search ................ 257/316, 257/319–320, 331, 347, 352–353, 365, E29.3, 257/E27.112; 438/149, 157, 164, 267

See application file for complete search history.

(56) References Cited

U.S. PATENT DOCUMENTS 5,460,988 A * 10/1995 Hong ......................... 438/259
5,712,180 A * 1/1998 Guterman et al. .......... 438/263
6,107,141 A * 8/2000 Hsu et al. ................... 438/267
6,157,061 A * 12/2000 Kawata ...................... 257/316
6,198,125 B1 * 3/2001 Yamazaki et al. .......... 257/316
6,411,548 B1 * 6/2002 Sakui et al. ........... 365/185.17
6,768,158 B1 * 7/2004 Lee et al. ................... 257/315
6,831,310 B1 * 12/2004 Mathew et al. ............. 257/270
2002/0125536 A1 * 9/2002 Iwasa et al. ................ 257/368
2003/0178670 A1 * 9/2003 Fried et al. ................. 257/315
2004/0004863 A1 * 1/2004 Wang ......................... 365/199
2004/0251487 A1 * 12/2004 Wu et al. ................... 257/315
2005/0063215 A1 * 3/2005 Yang .......................... 365/154

* cited by examiner

*Primary Examiner*—Mary Wilczewski
*Assistant Examiner*—Toniae M. Thomas
(74) *Attorney, Agent, or Firm*—Law Office of Charles W. Peterson, Jr.; Robert M. Trepp, Esq.

(57) ABSTRACT

A non-volatile storage cell in a Fin Field Effect Transistor (FinFET) and a method of forming an Integrated Circuit (IC) chip including the non-volatile storage cell. Each FET includes a control gate along one side of a semiconductor (e.g., silicon) fin, a floating gate along an opposite of the fin and a program gate alongside the floating gate. Control gate device thresholds are adjusted by adjusting charge on the floating gate.

20 Claims, 22 Drawing Sheets

DUAL FUNCTION FINFET, FINMEMORY AND METHOD OF MANUFACTURE

CROSS REFERENCE TO RELATED APPLICATION

The present invention is a related to U.S. patent application Ser. No. 10/717,737, entitled "DUAL GATE FINFET" to Zhu et al., filed Nov. 20, 2003, assigned to the assignee of the present invention and incorporated herein by reference.

BACKGROUND OF THE INVENTION

1. Field of the Invention

The present invention is related to nonvolatile storage and more particularly to integrated circuit chips including nonvolatile storage such as one or more cells or an array of nonvolatile random access memory (NVRAM) cells.

2. Background Description

Nonvolatile floating gate storage devices, such as may be used for memory cells in a nonvolatile random access memory (NVRAM), are well known in the industry. In a typical NVRAM cell, the cell's conductive state is determined by charge or lack thereof on the storage device's floating gate. The floating gate is an electrically isolated gate of a Field Effect Transistor (FET) stacked in a two device NAND-like structure with the gate of a select device. Charge is forced onto or removed from the floating gate through a thin insulator layer that, during a normal read, isolates the gate electrically from other adjoining conductive layers. For example, a negatively (or positively) charged floating gate may be representative of a binary one state, while an uncharged floating gate may be representative of a binary zero state or, vice versa.

Typically, the select device in the NAND-like structure is connected to a word line. In typical state of the art designs, adjacent cells are connected to a common bit line. Each of the word lines is uniquely addressable and physically distinct. Intersection of each word line with each bit line provides unique cell selection for reading and writing the selected cell. For reading, a read voltage (e.g., $V_{hi}$ or ground) is applied to a control gate (or program gate) that is capacitively coupled to floating gates of the nonvolatile devices of devices being read. Typically, the bit lines are pre-charged high. Thus, when a word line is raised, bit lines discharge for those devices programmed for zeros and do not those programmed for ones. For writing, a write voltage applied to the program gate is capacitively coupled to floating gates of the nonvolatile devices and, when the gate, source and drain voltages are biased properly, the charge changes on the floating gate, i.e., to write selected cells. Similarly, cells are biased to remove the charge from the floating gates during each erase.

The typically high voltages needed to write and erase each cell normally require a very complicated fabrication process. So, to minimize cell write voltages and for adequate read performance, the floating gate is large. Consequently, large floating gates account for much of the cell area for a typical NVRAM cell. While, reduced cell size cannot come at the expense of unacceptably degraded performance, designers normally strive for minimum cell size to achieve maximum cell density for reduced storage costs.

Thus, there is a need for smaller, denser NVRAM cells.

SUMMARY OF THE INVENTION

It is a purpose of the invention to improve non-volatile storage device density;

It is another purpose of the invention to improve NVRAM cell density.

The present invention relates to a non-volatile storage cell in a Fin Field Effect Transistor (FinFET) and a method of forming an Integrated Circuit (IC) chip including the non-volatile storage cell. Each FET includes a control gate along one side of a semiconductor (e.g., silicon) fin, a floating gate along an opposite of the fin and a program gate alongside the floating gate. Control gate device thresholds are adjusted by adjusting charge on the floating gate.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
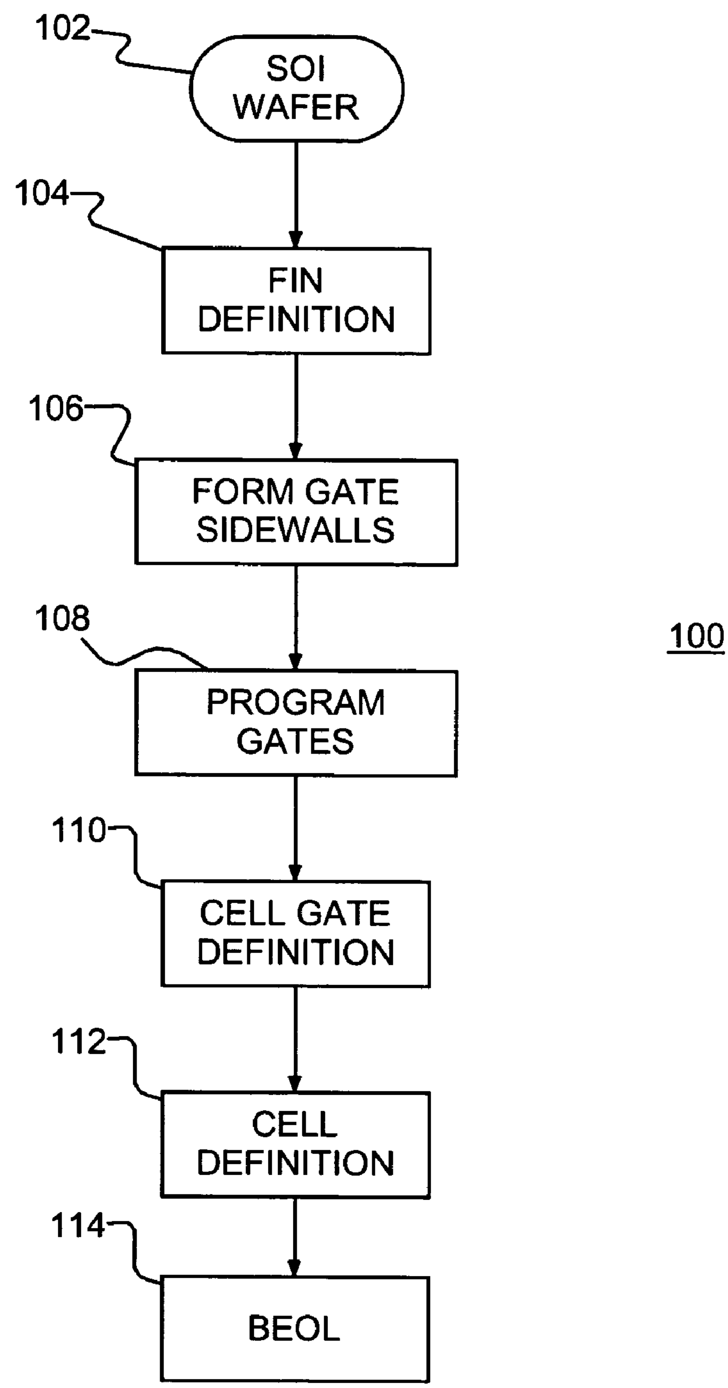
FIG. 1 shows an example of a method for forming nonvolatile-storage FinFET cells, e.g., NonVolatile Random Access Memory (NVRAM) cells in an NVRAM array on integrated circuit (IC), according to a preferred embodiment of the present invention.

Turning now to the drawings and, more particularly, FIG. 1 shows an example of a method for forming nonvolatile-storage FinFET cells, e.g., NonVolatile Random Access Memory (NVRAM) cells in an NVRAM array on an integrated circuit (IC), according to a preferred embodiment of the present invention. Each preferred embodiment cell includes a mutli-gate FET formed at a vertical semiconductor fin, e.g., a silicon fin. Two gates, a control gate and a floating gate are located on opposite sides of the silicon fin forming a FinFET with charge storage capability, i.e., at the storage gate. The cell is accessed through the control gate with the floating gate operating to effectively back bias the FinFET and shift the threshold for the control gate device.

Cell formation begins in step 102 with a layered wafer with a semiconductor surface layer, preferably, a typical Silicon On Insulator (SOI) wafer. In step 104 device fins are defined from the semiconductor surface layer. In step 106 gate sidewalls are formed along opposite sides of the fins, one sidewall for cell control gates and the other for cell floating gates. Typically, gate dielectric separates the gate sidewalls from the fins. In step 108 program gate material is formed adjacent to floating gate sidewalls. A suitable dielectric separates the program gate material from the floating gate sidewalls. In step 110, individual control and floating gates are defined (e.g., etched) from the gate sidewalls and individual program gates are defined (e.g., etched) from the program gate material to define individual nonvolatile-storage cells. Thus, for each nonvolatile-storage cell, at the very least, a FinFET control gate and a FinFET floating gate is etched from control gate and floating gate sidewalls for adjacent cells in the same fin. Thereafter in step 112, device definition (e.g., source/drain formation) and processing continues, forming source/drain diffusions. Finally, normal middle of the line (MOL) and back end of the line (BEOL) metallization and passivation may be used in step 114, e.g., wiring devices together and wiring circuits to pads and off chip.

Figure 2A:
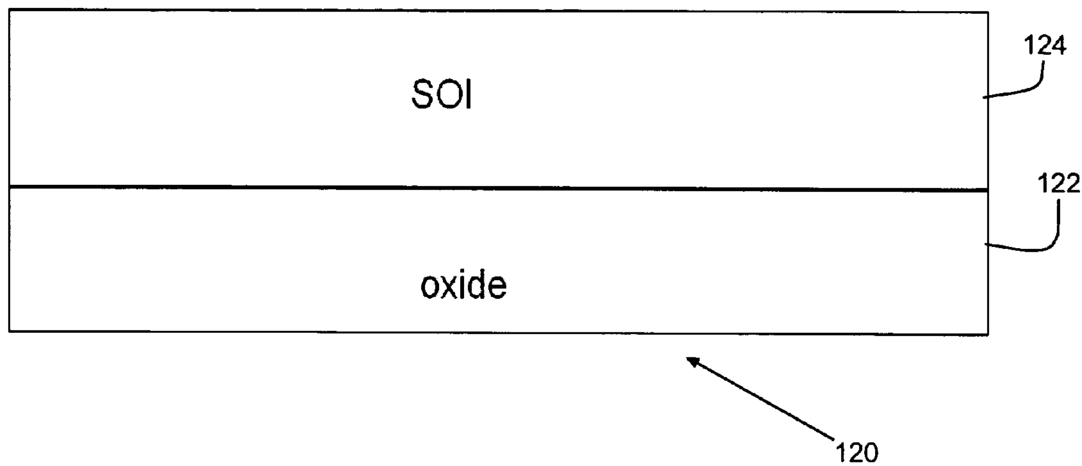
FIGS. 2A–C with reference to FIG. 1, show a cross section of a wafer (e.g., provided in 102) in fin formation.
Figure 2B:
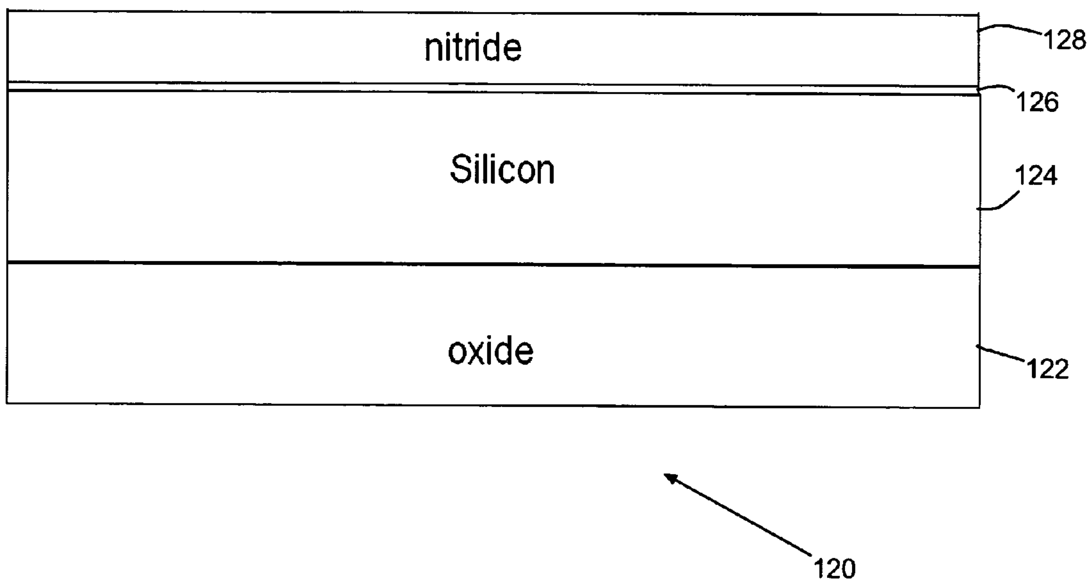
Figure 2C:
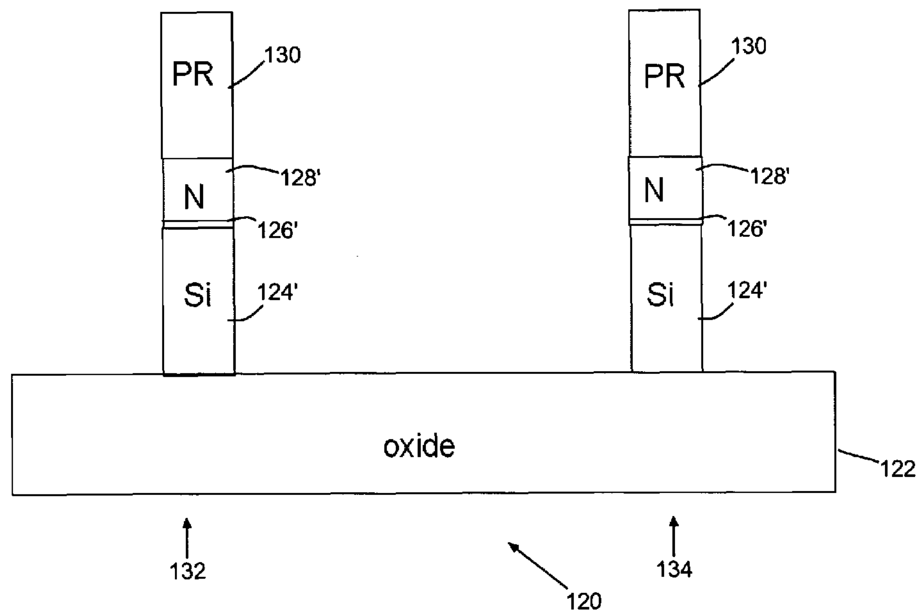

FIGS. 2A–C with reference to FIG. 1, show a cross section of a wafer 120 (e.g., provided in 102) in a first example of fin formation step 104. In this example, the wafer 120 is a SOI wafer with an insulator layer 122, e.g., a Buried Oxide (BOX) layer, supporting a semiconductor surface layer 124, e.g., a silicon layer on the BOX layer 122. Typically, a silicon substrate layer (not shown) supports the BOX layer 122. Although described herein as a silicon layer, the semiconductor layer 124 may be a layer of Silicon (Si), Germanium (Ge), SiGe, or any other suitable semiconductor material. A thin insulator layer 126 in FIG. 2B, preferably, 5–10 m thick, is formed on the surface silicon layer 124, e.g., oxide is grown on the surface of the silicon layer 124. The oxide layer 126 is followed by a capping layer 128. Preferably, the capping layer 128 is a 50–80 nm thick nitride layer. In FIG. 2C a fin pattern 130 is formed on the capping layer 128 by depositing and patterning photoresist using well known photolithographic patterning techniques. Finally, layered fins 132, 134 are defined on the BOX layer 122 using typical semiconductor processing to remove unmasked portions of the capping layer 128, the thin insulation layer 126 and the silicon layer 124, e.g., directionally etching each with a suitable etchant. Thus, each layered fin 132, 134 locates what may be a column of cells and includes a thin oxide 126' on a silicon fin 124' that is capped with nitride 128'. Once the layered fins 132, 134 partially define cell locations, the photoresist pattern 130 can be removed.

Figure 3:
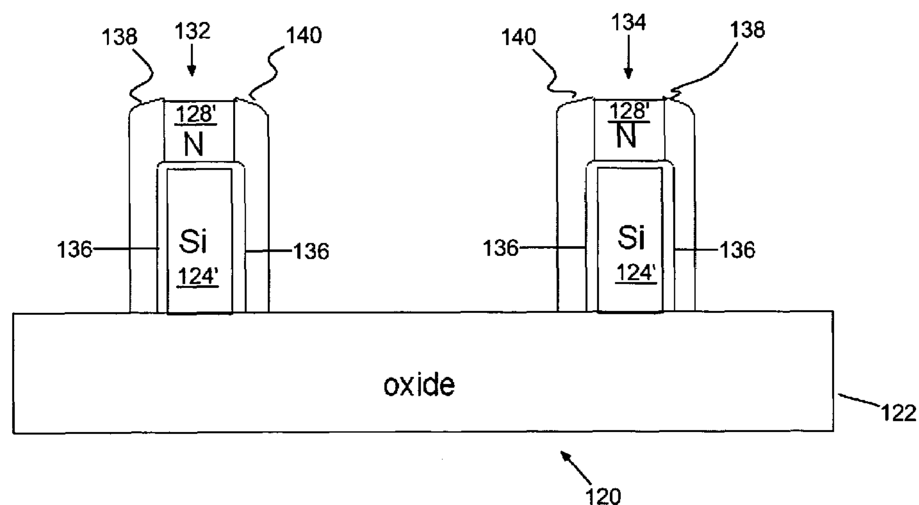
FIG. 3 with reference to FIG. 1, shows the step of forming gate sidewall layers or spacers along opposite sides of the layered fins.

FIG. 3 with reference to FIG. 1, shows the step 106 of forming gate sidewall layers or spacers along opposite sides of the layered fins 132, 134, simultaneously in this example. So, first, a gate dielectric layer 136 is formed (e.g., a thin oxide layer is grown) on exposed sidewalls of silicon fins 124', merging with the remaining oxide between the silicon fins 124' and caps 128' to form a layer 136 on three surfaces of the silicon fins 124'. Forming the gate dielectric layer 136 may negligibly thicken BOX layer 122 at corners. Sidewall spacers 138, 140 of gate material are formed adjacent to each of the layered fins 132, 134. The gate material may be any suitable conductive material such as, for example, metal, doped Si, doped Ge, doped SiGe, a metal silicide and, preferably, in situ doped polysilicon. Thus, at each layered fin 132, 134, one sidewall spacer is a control gate sidewall spacer 138 on one side of the layered fins 132, 134 and the other defines a floating gate sidewall spacer 140 on the opposite side. The thickness of the sidewall spacers 138, 140 determine the floating gate thickness, preferably, 10 nm.

Figure 4A:
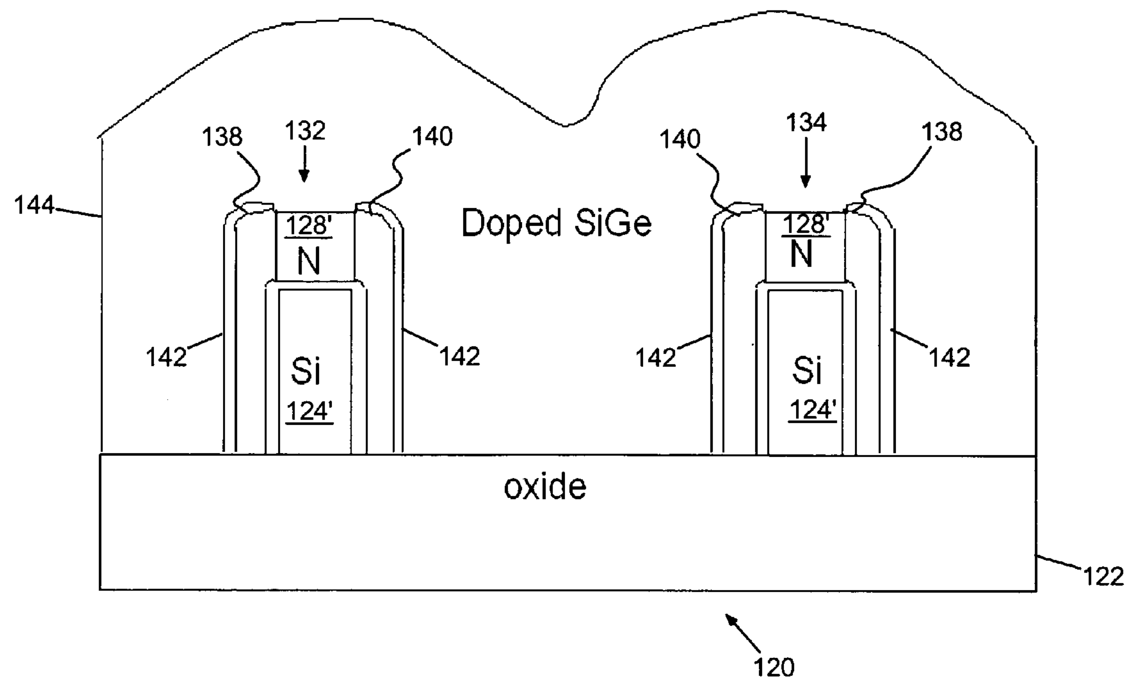
FIGS. 4A–B shows forming program gates adjacent and parallel to the floating gates.
Figure 4B:
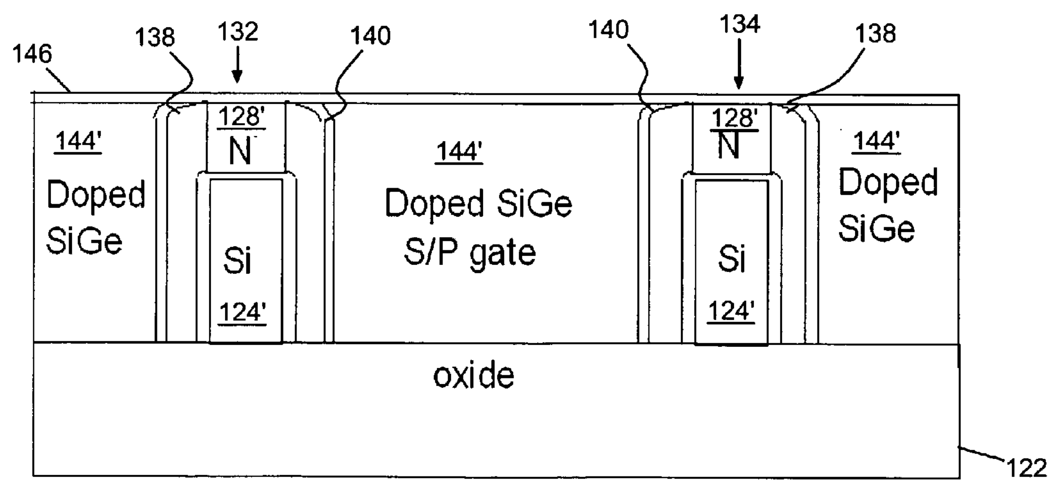

Next as shown in FIGS. 4A–B with reference to step 108 of FIG. 1, program gates are formed adjacent and parallel to the floating gates 140. First, a program gate dielectric 142 is formed on the exposed sidewall surface of the gate sidewall spacers 138, 140. Preferably, the gate dielectric 142 is formed by oxidizing the sidewall spacer material. Then, a layer 144 of program gate material is deposited on the wafer 120. The program gate material may be any suitable conductive material such as, for example, metal, doped Si, doped Ge, doped SiGe, a metal silicide and doped polysilicon. Preferably, the program gate material layer 144 is a 100–250 nm thick layer of SiGe that is in-situ doped of an appropriate dopant. The program gate material layer 144 is planarized, e.g., using Chemical Mechanical Polishing (CMP or chem-mech polished), to the nitride caps 128', which defines program gates 144' between cell columns and adjacent to floating gates 140. Additionally, excess program material 144' remains on opposite sides of array columns at layered fins 132, 134. Then, a thin dielectric material layer 146 (preferably, a 10 nm thick of layer of nitride) is formed on the planarized surface.

Figure 5A:
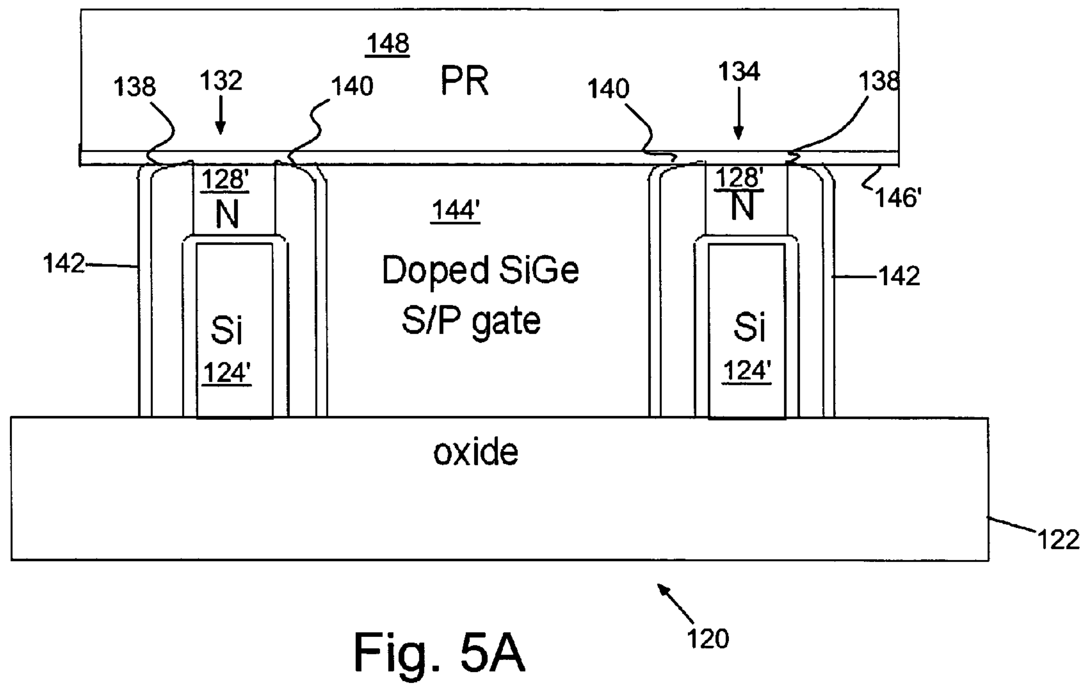
FIGS. 5 A–C show an example of the first step in the cell gate definition.
Figure 5B:
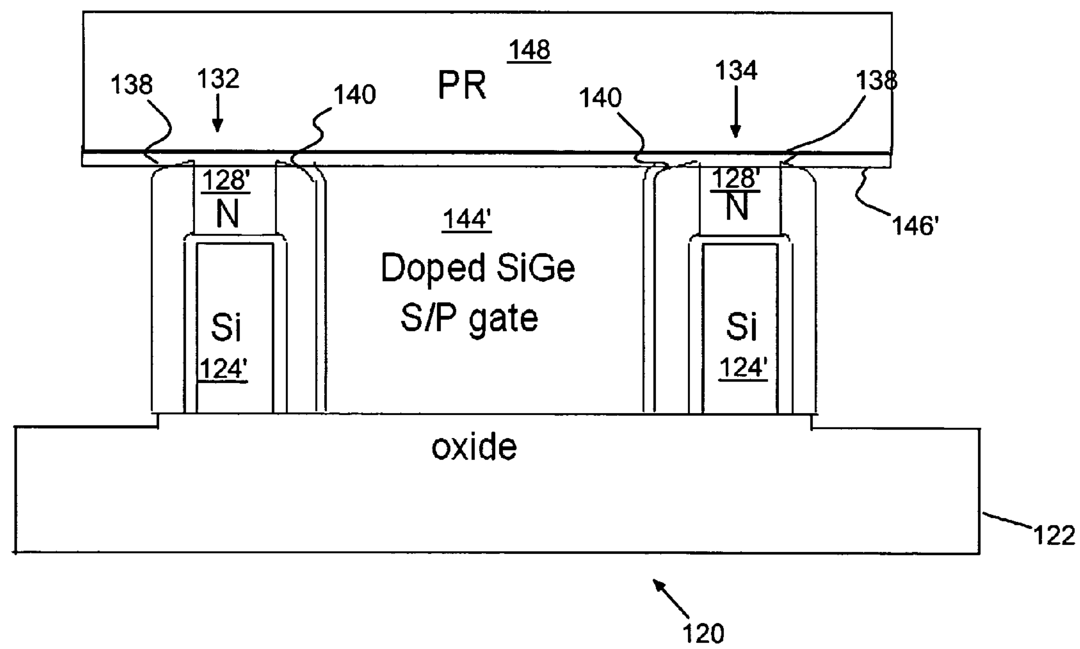
Figure 5C:
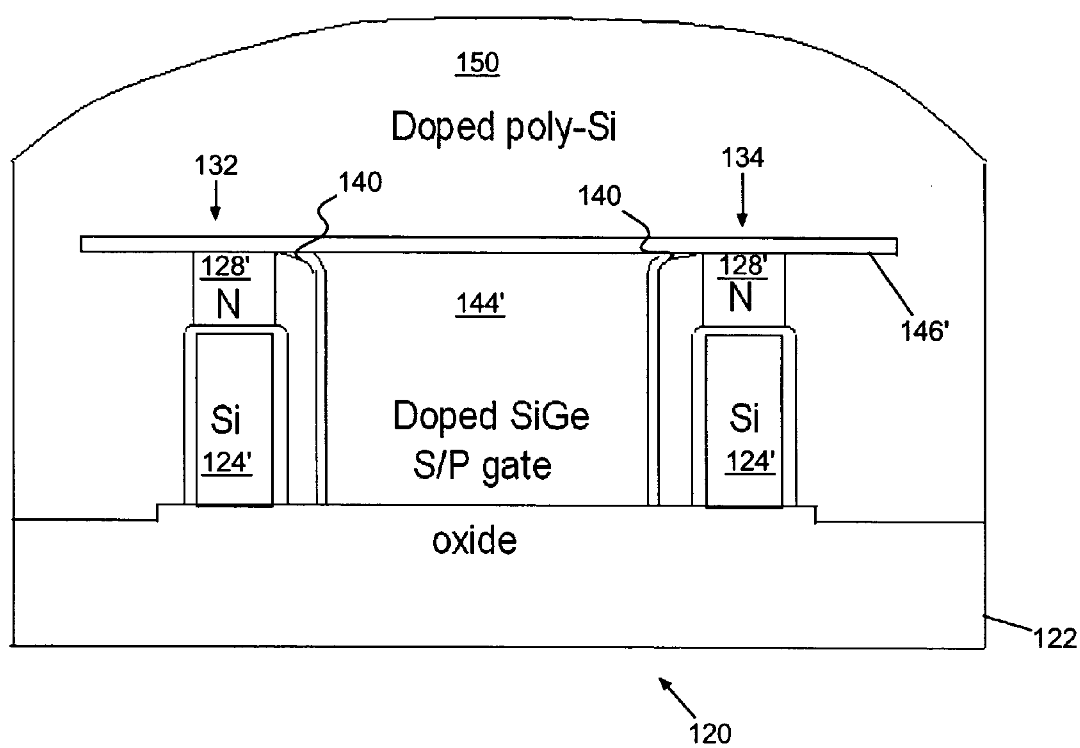

FIGS. 5A–C show an example of the first step in the cell gate definition 110 of FIG. 1. A photoresist layer is formed on the thin nitride layer 146. The photoresist layer is patterned using a typical photolithographic patterning, leaving pattern 148 above the program gates 144'. Then, using a Reactive Ion Etch (RIE), exposed nitride is removed from the thin nitride layer 146, which patterns the nitride 146' and exposes excess program gate material, i.e., between adjacent control gate sidewalls 138. The exposed gate material is removed, e.g., using a RIE and stopping on buried oxide layer 122. A simple wet etch removes the gate oxide 142 from the control gate sidewall spacers 138, to re-expose the side surface of the control gate sidewall spacers 138. Typically, the BOX layer 122 may also be etched, slightly notching the BOX layer 122 surface adjacent to the control gates 136. The photoresist 148 is removed and the wafer is cleaned, e.g., using a hydrofluoric acid (HFl) etch. Then, control gate material is deposited, preferably using an in-situ doped polysilicon. The deposited polysilicon merges with the control gates 136 and forms a uniform control gate conductor layer 150.

Figure 6A:
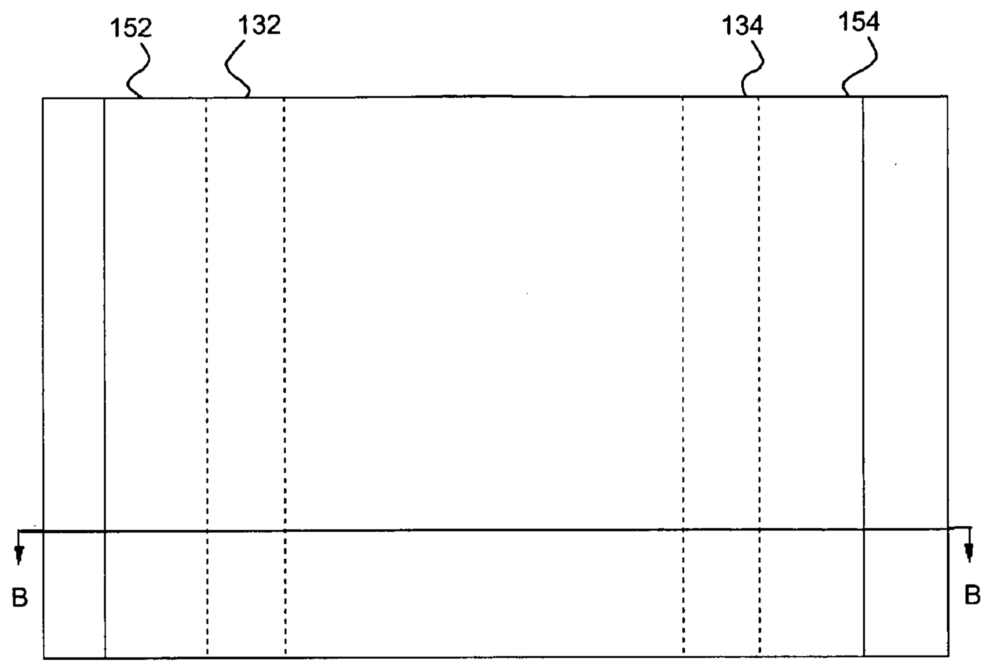
FIGS. 6A–B shows chem-mech polishing the control gate layer to separate individual rows of control gates.
Figure 6B:
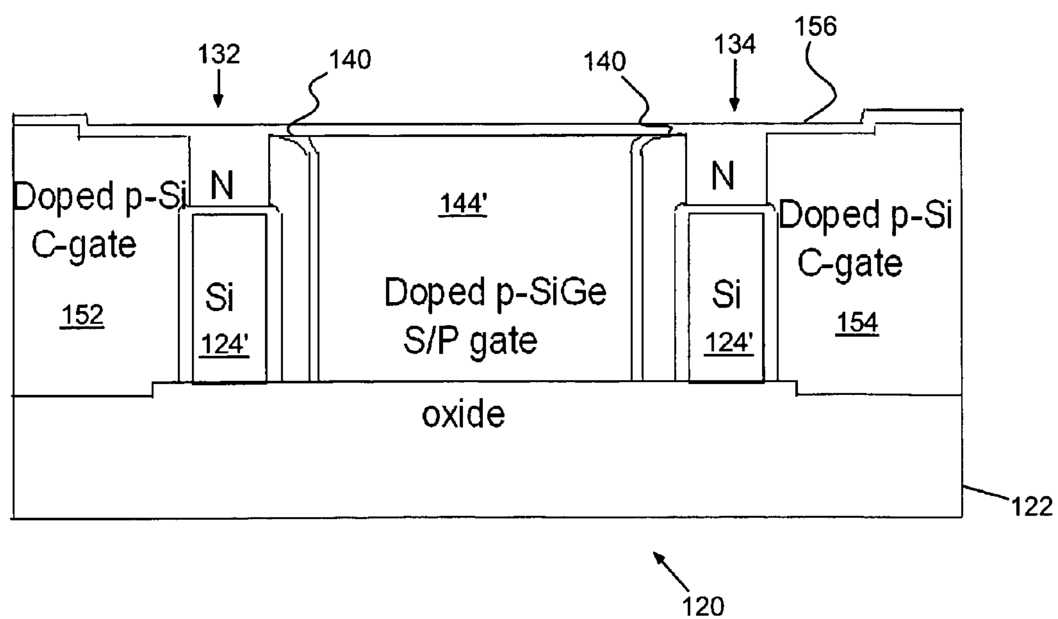

Next, as can be seen in FIGS. 6A–B, the control gate layer (150 in FIG. 5C) is chem-mech polished to separate individual rows of control gates 152, 154 with FIG. 6A showing a top view and FIG. 6B showing a cross section through BB. First, the wafer is chem-mech polished to remove upper portions of the doped polysilicon control gate layer 150 and stopping on the thin nitride pattern 146'. The exposed nitride layer pattern 146' is removed from the surface of the wafer 120, e.g., using a suitable etchant to clean the nitride pattern 146' from the surface. Then, a dielectric layer 156, preferably, a 10 nm layer of nitride, is formed on the surface e.g., deposited. At this point, the wafer surface has alternating rows of gates and fins, e.g., 152, 132, 140/146/140, 134, 154 covered by nitride layer 156.

Figure 7A:
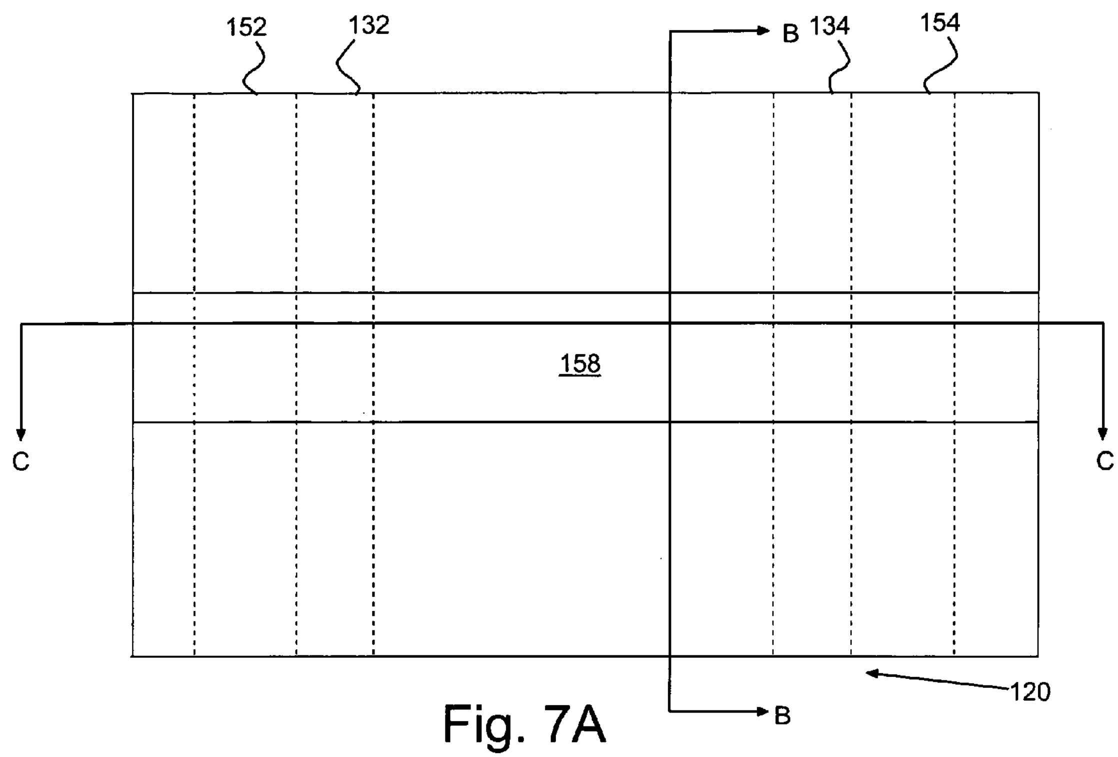
FIGS. 7A–C shows a gate-location photoresist-pattern formed on the thin nitride layer.
Figure 7B:
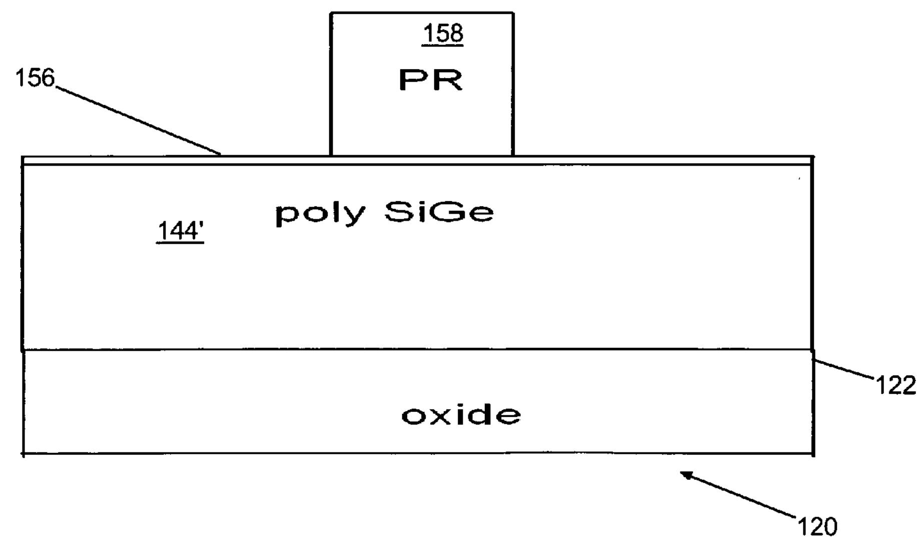
Figure 7C:
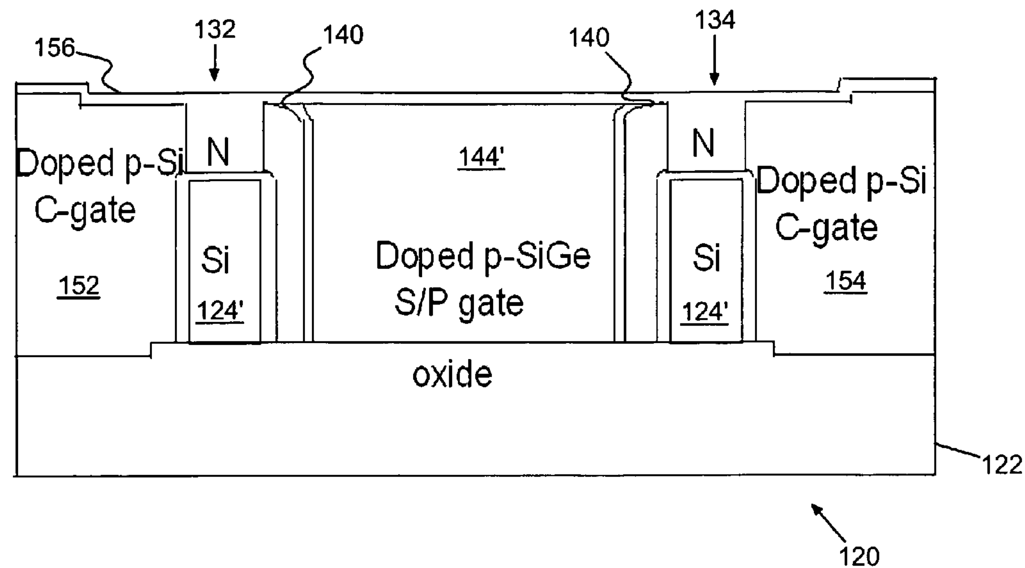

Cell definition (step 112 of FIG. 1) begins in FIGS. 7A–C as a gate pattern 158 is formed of photoresist on the thin nitride layer 156 with FIG. 7A showing a top view, FIG. 7B showing a cross section through B—B and FIG. 7C showing a cross sections through since C—C. By defining gates, the photoresist pattern 158 defines cells at each layered fin 132, 134.

Figure 8A:
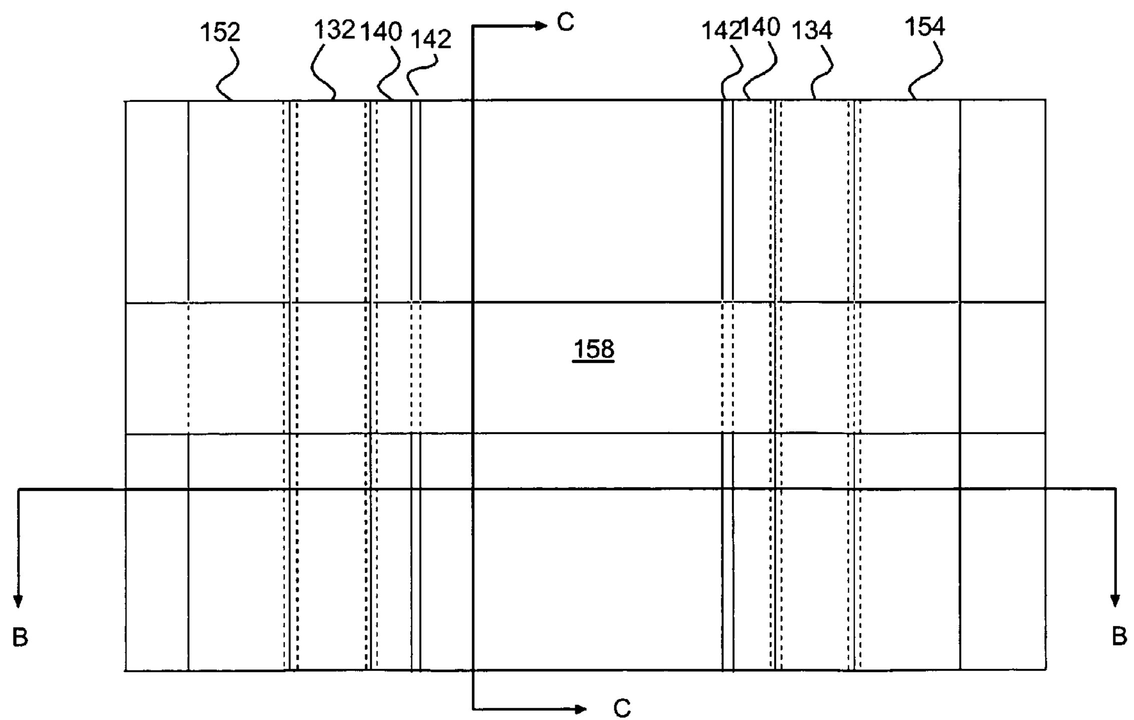
FIGS. 8A–C shows definition of individual program gates or pairs of program gates.
Figure 8B:
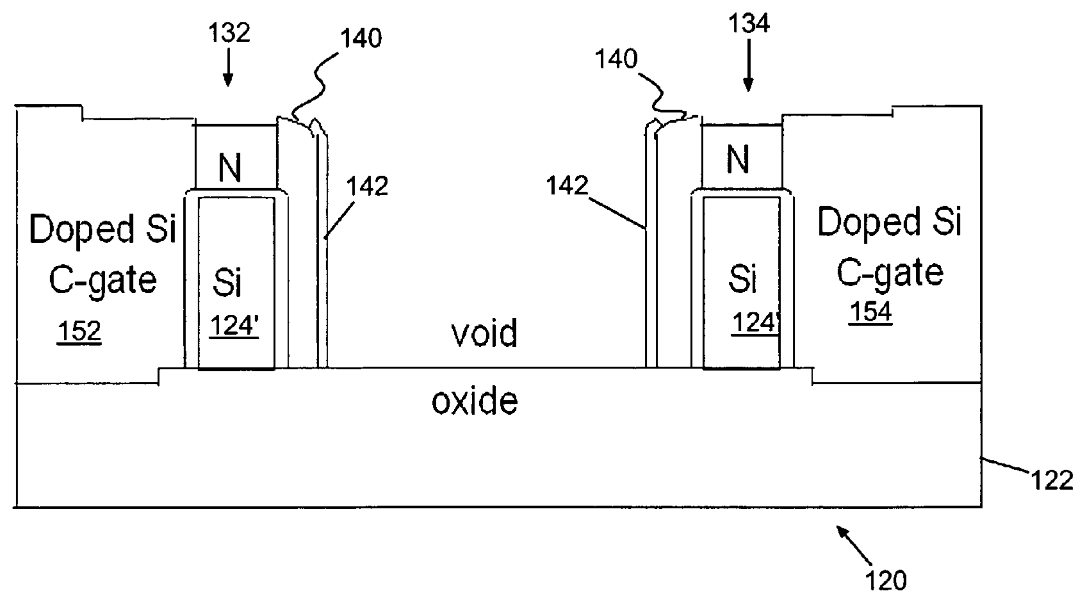
Figure 8C:
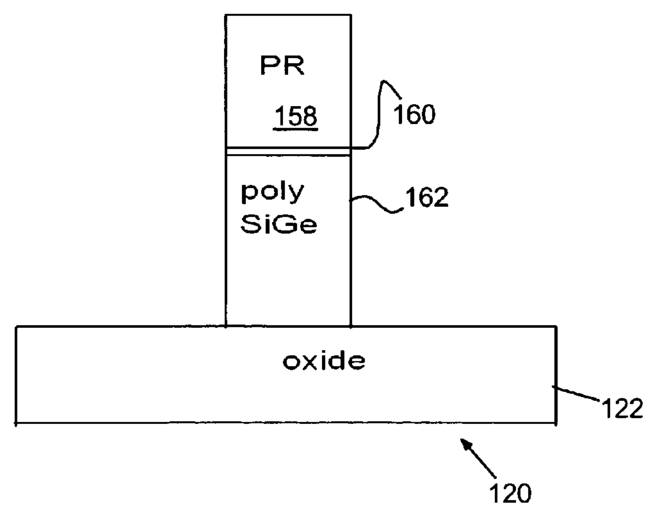

Next, in FIGS. 8A–C shared program gates are defined for pairs of cells at adjacent fins 132, 134 with FIG. 8A showing a top view, FIG. 8B showing a cross section through B—B and FIG. 8C showing cross section through C—C. The photoresist pattern 158 is imprinted in the nitride layer 156 by removing exposed portions. Preferably, a RIE is used to strip the exposed areas of nitride layer 156, leaving nitride pattern 160. Then, an etchant that is selective to silicon, nitride and oxide, imprints the pattern into the SiGe 144', removing exposed SiGe to the buried oxide layer 122 to define program gates 162 and selectively re-exposing the program gate oxide 142 therebeneath.

Figure 9A:
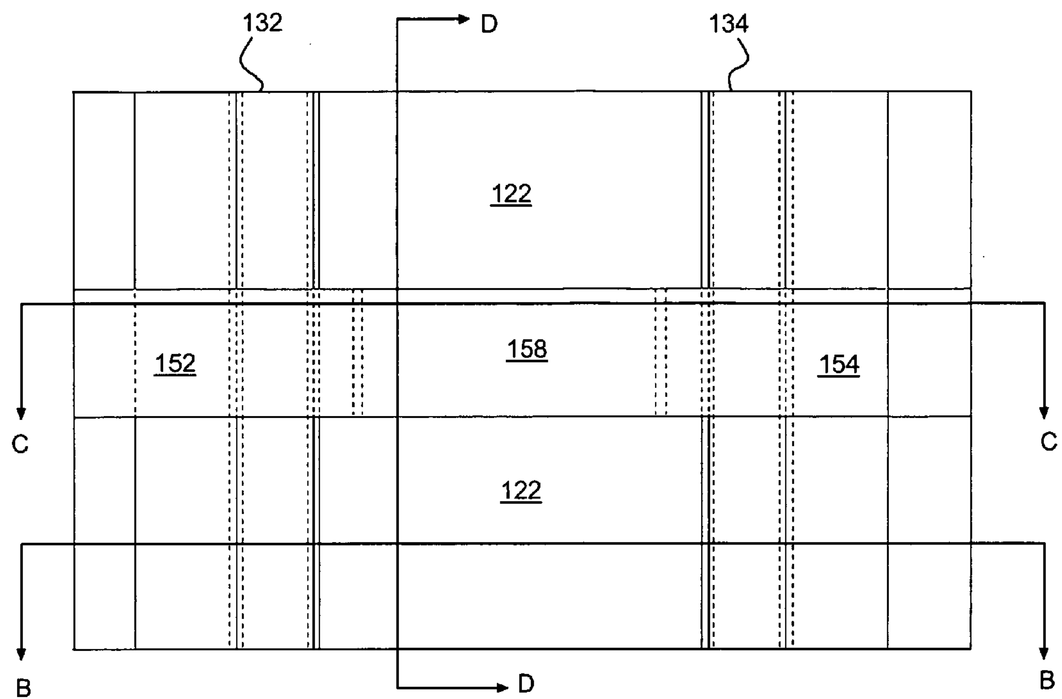
FIGS. 9A–D shows etching the floating gate sidewall spacers to define floating gates.
Figure 9B:
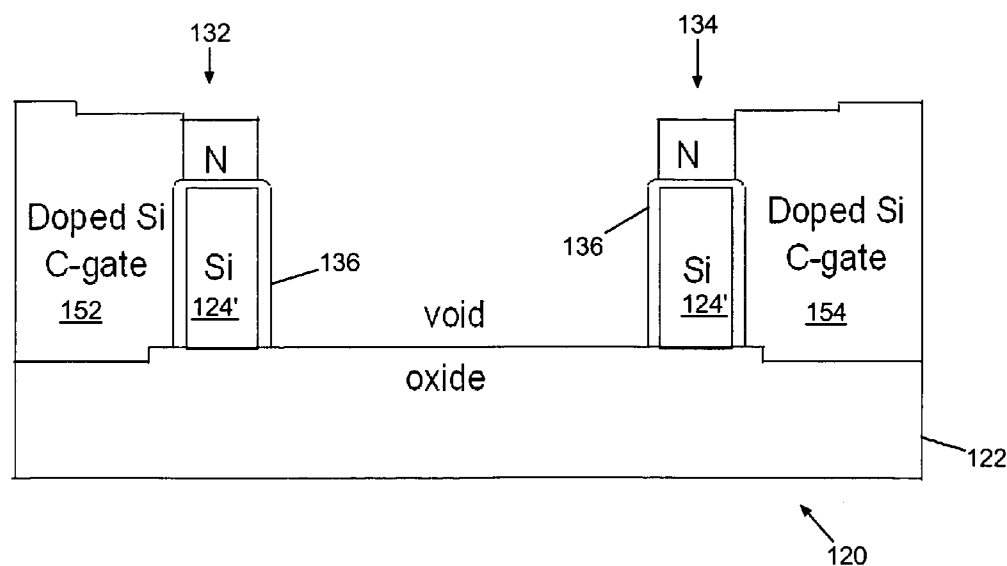
Figure 9C:
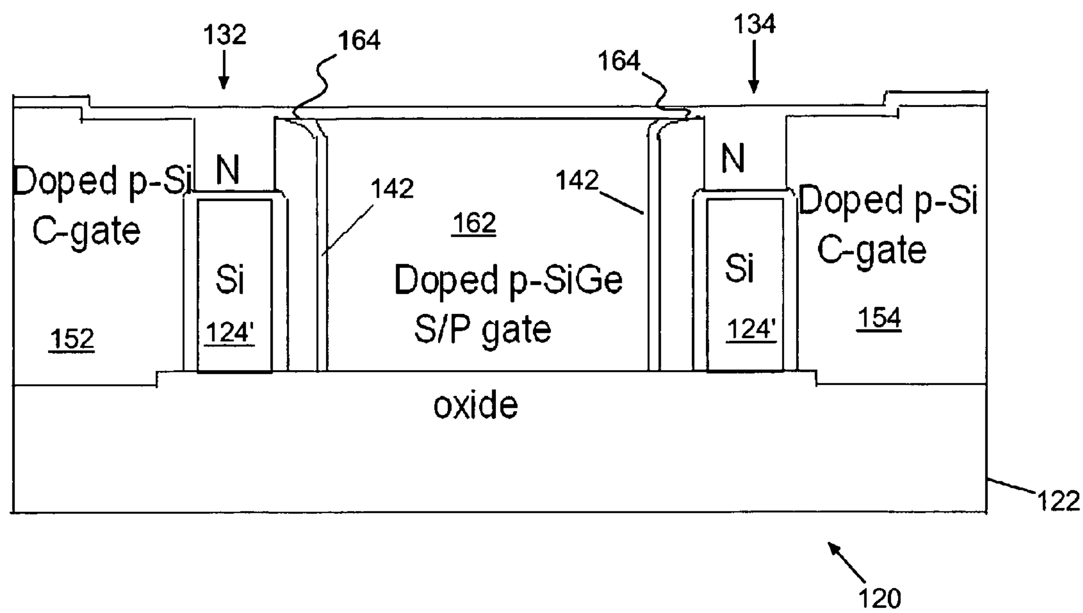
Figure 9D:
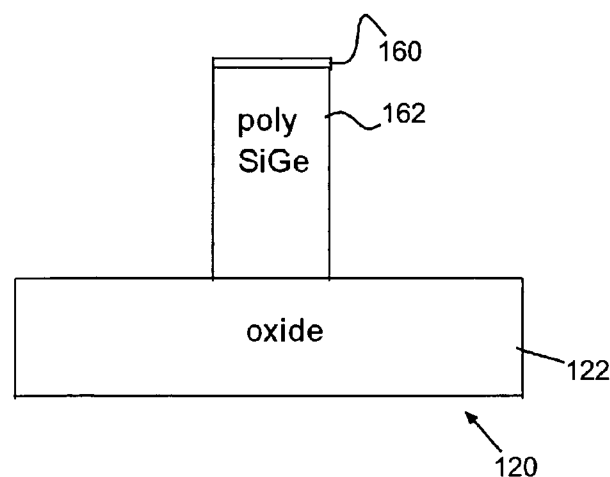

Next, in FIGS. 9A–C the floating gate sidewall spacers are etched to define individual floating gates 164 with FIG. 9A showing a top view, FIG. 9B showing a cross section through B—B, FIG. 9C showing a cross section through CC and FIG. 9D showing a cross sections through the D—D. Exposed program gate dielectric 142 is removed, e.g., using a typical wet etch to strip the exposed oxide. Removing the program gate dielectric exposes the floating gate sidewall spacers everywhere but under the photoresist pattern 158. So, the exposed portions of floating gate sidewall spacers 138 are removed to define individual floating gates 164 in each cell 132, 134, e.g., using a wet etch. It should be noted that as the exposed portions of the floating gate spacers 140 are removed, the upper surface of the control gates 150' in exposed areas may also be removed by the thickness of the floating gates spacers. However, since the control gates 152, 154 are typically much thicker than the sidewall spacers, the upper surface remains above the thin oxide 126' in the layered fins 132, 134.

Figure 10A:
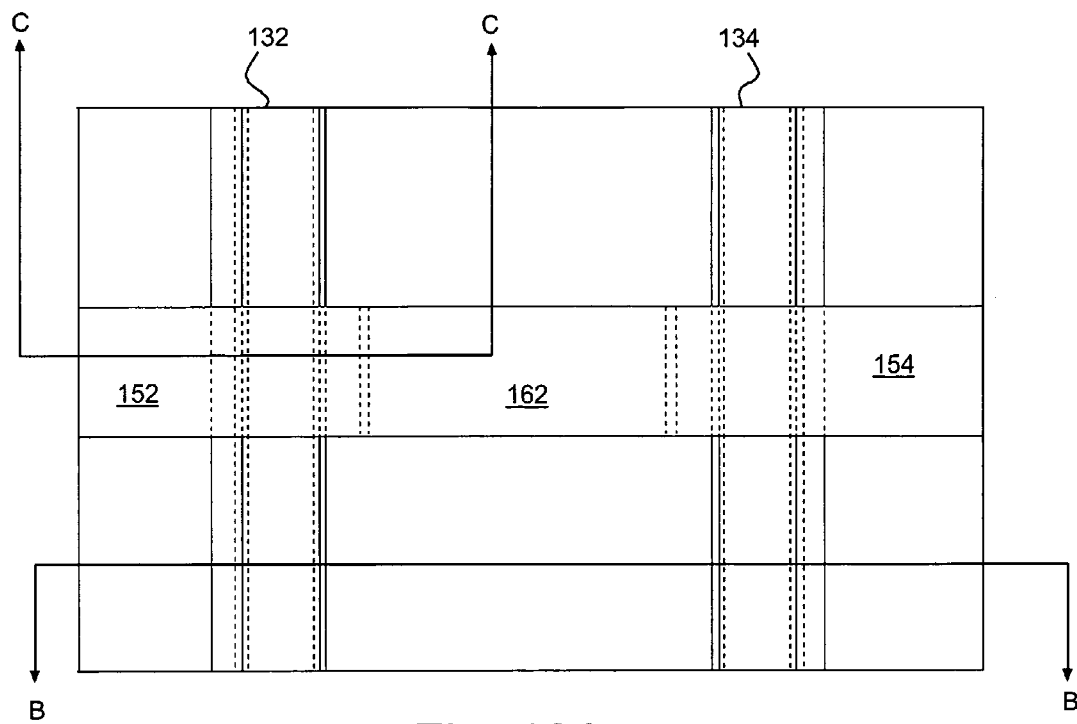
FIGS. 10A–C show completion of cell definition for a first embodiment cell.
Figure 10B:
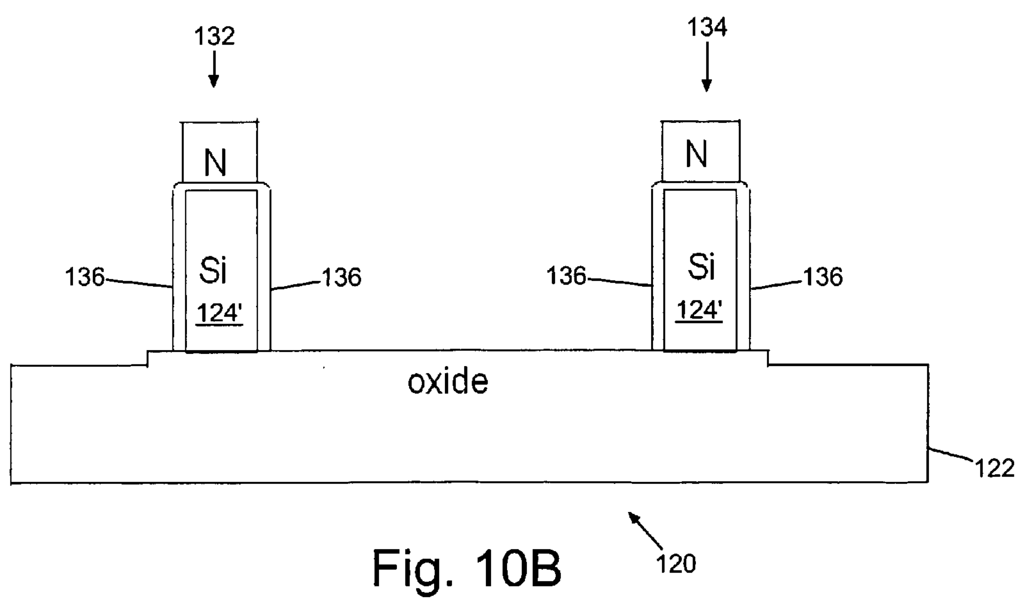
Figure 10C:
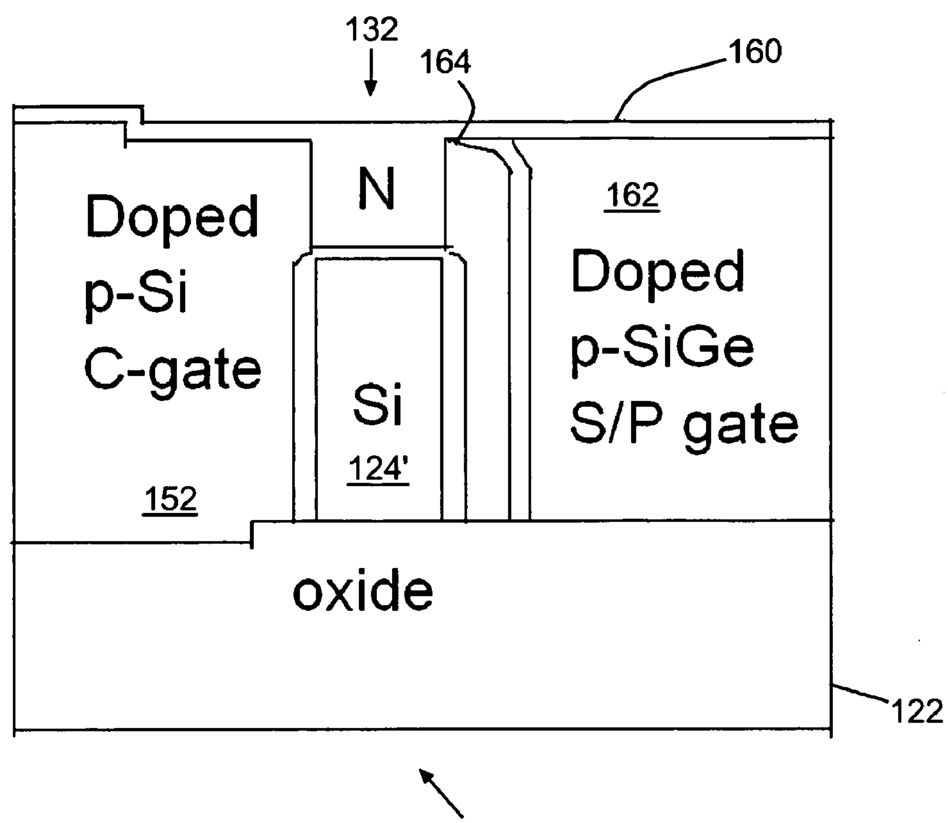
Figure 11A:
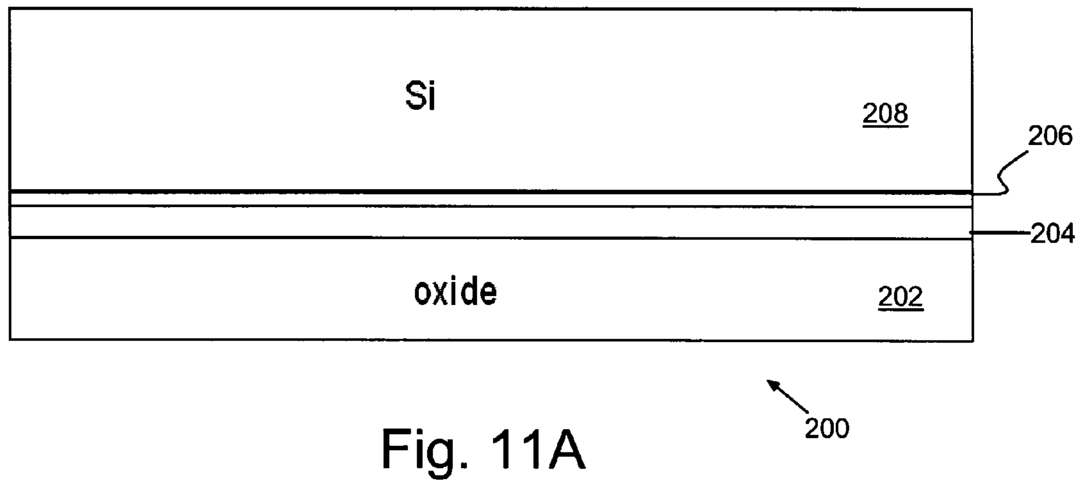
FIG. 11A–D show an example of fin definition according to a second preferred embodiment of the present invention.
Figure 11B:
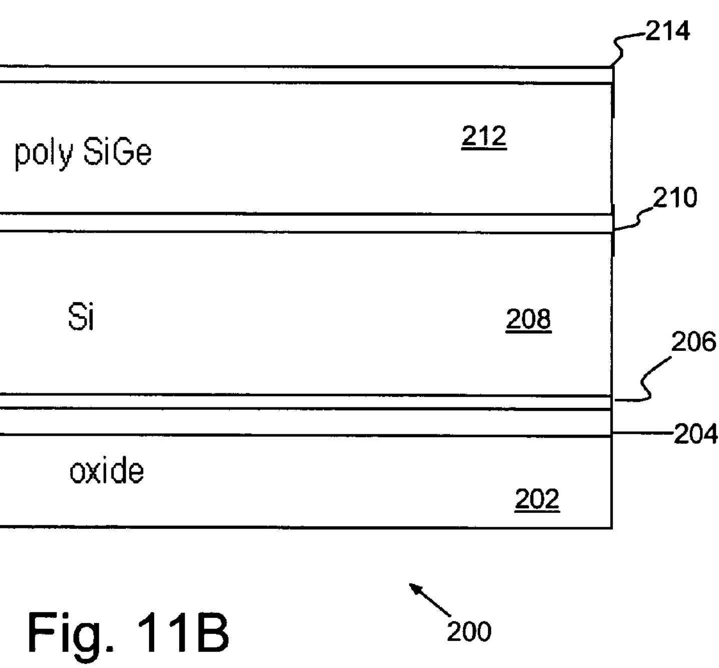
Figure 11C:
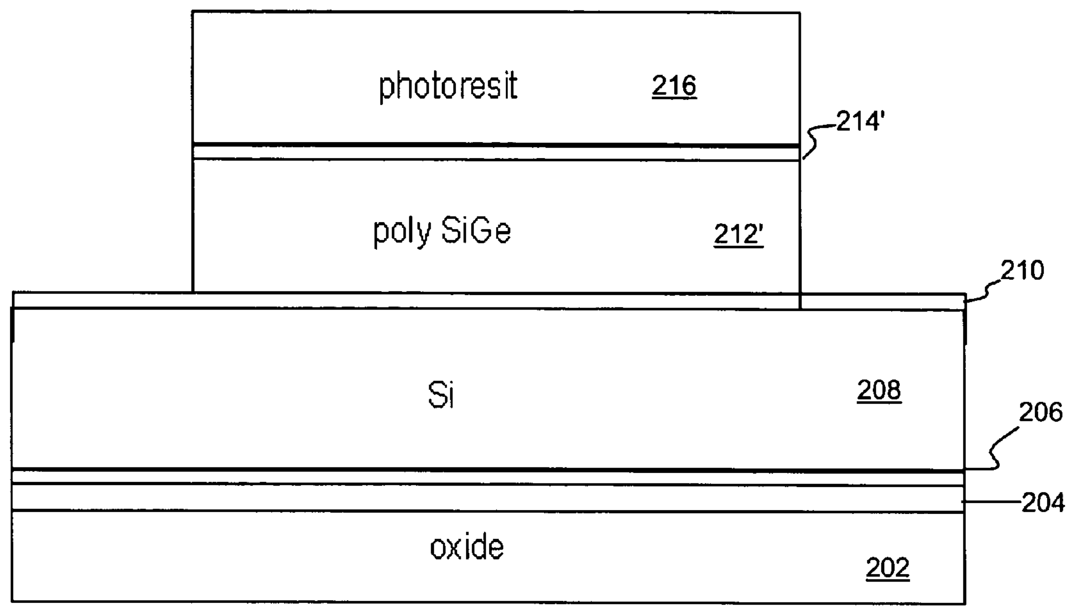
Figure 11D:
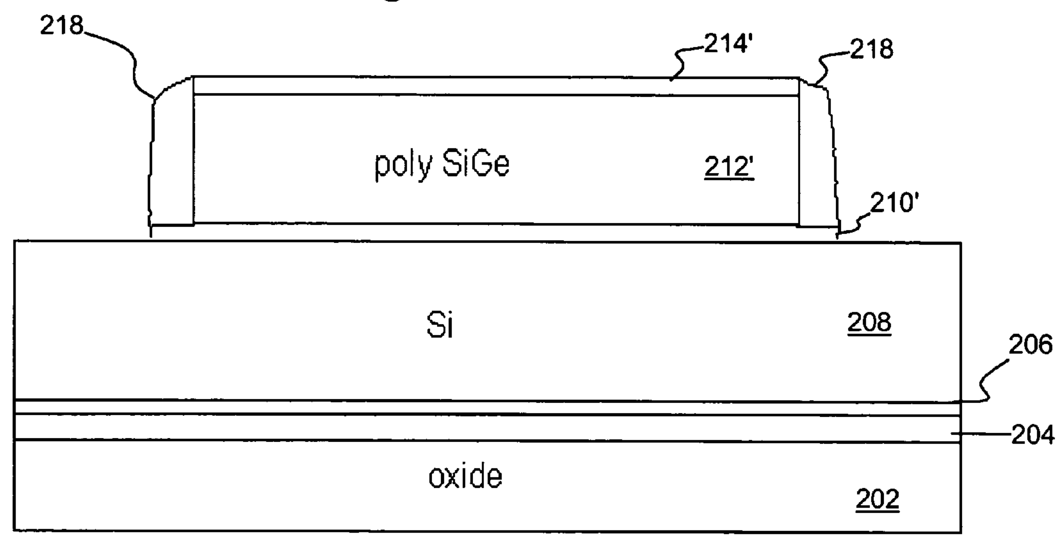

FIGS. 10A–C show completion of cell definition (step 112 of FIG. 1) for this first preferred embodiment cell with FIG. 10A showing a top view, FIG. 10B showing a cross-sectional view through B—B and FIG. 10C showing a cross section for a single cell at C—C. Because the floating gates 164 and the control gates 152, 154 are the same material, if a wet etch is used to define the floating gates, the control gates 152, 154 must be defined without damaging the defined floating gates. So, for example, a RIE may be used that is selective to SiGe to remove exposed control gate material and stopping on the buried oxide layer 122.

Thus, having isolated cell gates 152, 154, 162, 164 for adjacent cells (at 132, 134), source/drain diffusions may be implanted into the silicon fins 124', e.g., with an angled implant through the sides of the fins 124' in exposed areas or, by selectively removing the exposed portions of the nitride cap and implanting the top of the silicon fins 124'. Individual cells may share source/drain regions with adjacent cells at the same fin 124' or, optionally, the fins 124' maybe etched to separate adjacent cells. Normal MOL and BEOL metallization and passivation may be used (in step 114 of FIG. 1), providing contacts to cells, e.g., at the gates and source/drain regions, and wiring devices together to connect the rows and columns into an array and wiring the array and other circuits to pads and off chip.

FIG. 11A–D show an example of fin definition step 104, defining fins on a bonded SOI wafer 200 with a base oxide layer 202 supporting a nitride bonding layer 204 according to a second preferred embodiment of the present invention. A thin oxide layer 206 separates the nitride layer 204 from a semiconductor (silicon) surface layer 208. A thin dielectric layer 210 is formed on the silicon layer 208. Preferably, the thin dielectric layer 210 is a 10–20 nm thick nitride layer. A sacrificial layer 212 (preferably, a 50–70 nm thick layer of polycrystalline SiGe (poly-SiGe)) is formed on the thin nitride layer 210. Then, another thin dielectric layer 214 is formed on the sacrificial layer 212. Preferably, the second thin dielectric layer 214 is also a 10–20 nm thick nitride layer. A photoresist pattern 216 is formed in the second thin nitride layer 214. Exposed portions of the second thin nitride layer 214 and the sacrificial layer 212 are selectively removed. For example, a RIE removes the nitride, followed by a suitable etchant to remove the poly-SiGe to the first deposited dielectric layer 210. Finally, dielectric spacers 218 are formed along the sidewalls of the remaining portions of the sacrificial layer 212'. For example, a 10–30 nm thick oxide may be grown on exposed sidewalls of sacrificial layer 212'. The photoresist pattern 216 may be removed before forming the sidewall spacers 218 or shortly thereafter. The sidewall spacers 218 define fin location and thickness. Once the spacers 218 have been formed, the remaining exposed portions of the first thin nitride layer 210 may be removed to re-expose portions of the silicon surface layer 208.

Figure 12A:
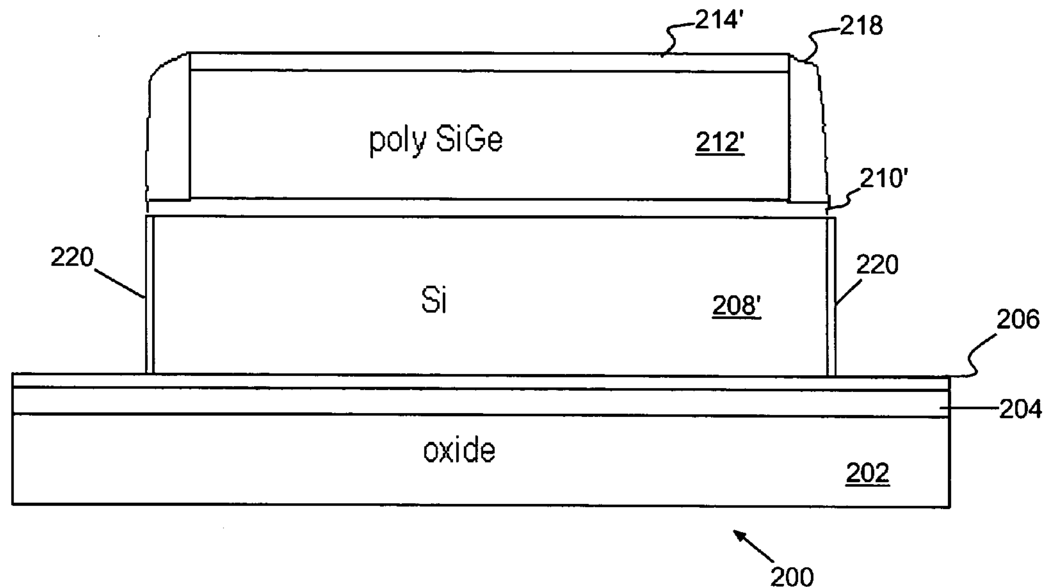
FIGS. 12A–B show an example of the forming gate sidewalls on the bonded wafer.
Figure 12B:
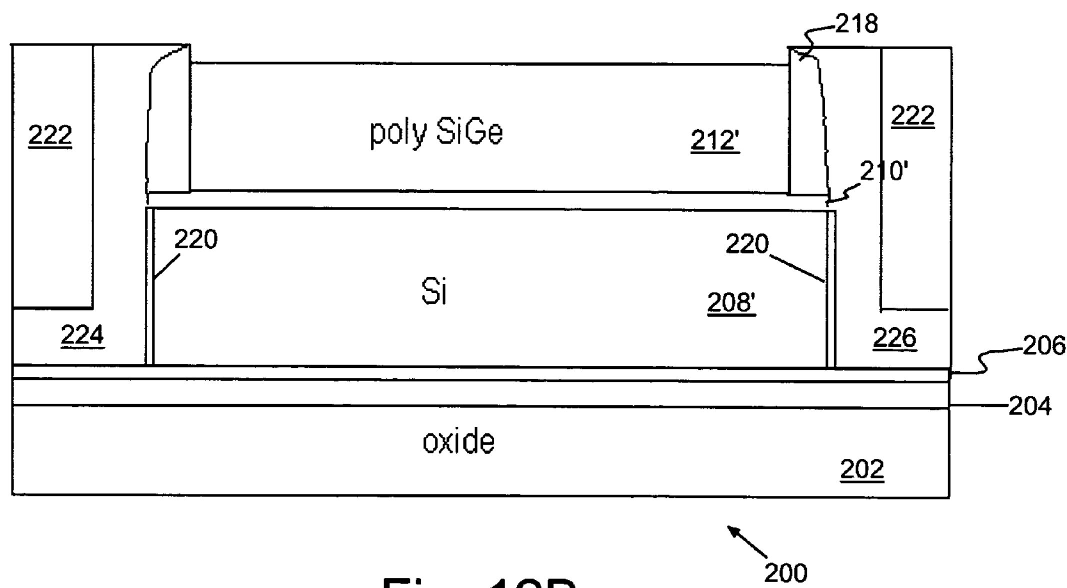

FIGS. 12A–B show an example of forming gate sidewalls on the bonded wafer 200 in step 106 of FIG. 1. First, exposed portions of the silicon layer 208 are etched to the oxide layer 206. Then, a gate dielectric (oxide) layer 220 is formed, at last at either end of the etched silicon layer 208'. Next a conformal gate material layer (preferably, polysilicon) is formed on the wafer 200. Fill material 222 (preferably, oxide) is formed on the conformal gate layer. Control gate sidewalls 224, 226 are defined by planarizing the wafer 200. For example, the wafer 200 may be chem-mech polished at least to the second thin nitride layer 214' to remove upper horizontal portions of the conformal gate layer and surface fill material 222. The exposed remaining portions of the second thin nitride layer 214' is removed. A typical etchant may be used, for example, to strip the nitride and re-expose the underlying sacrificial layer 212'. Thus, control gate sidewalls 224, 226 are formed at cell locations and fill oxide 222 remains above the control gate sidewalls 224, 226.

Figure 13A:
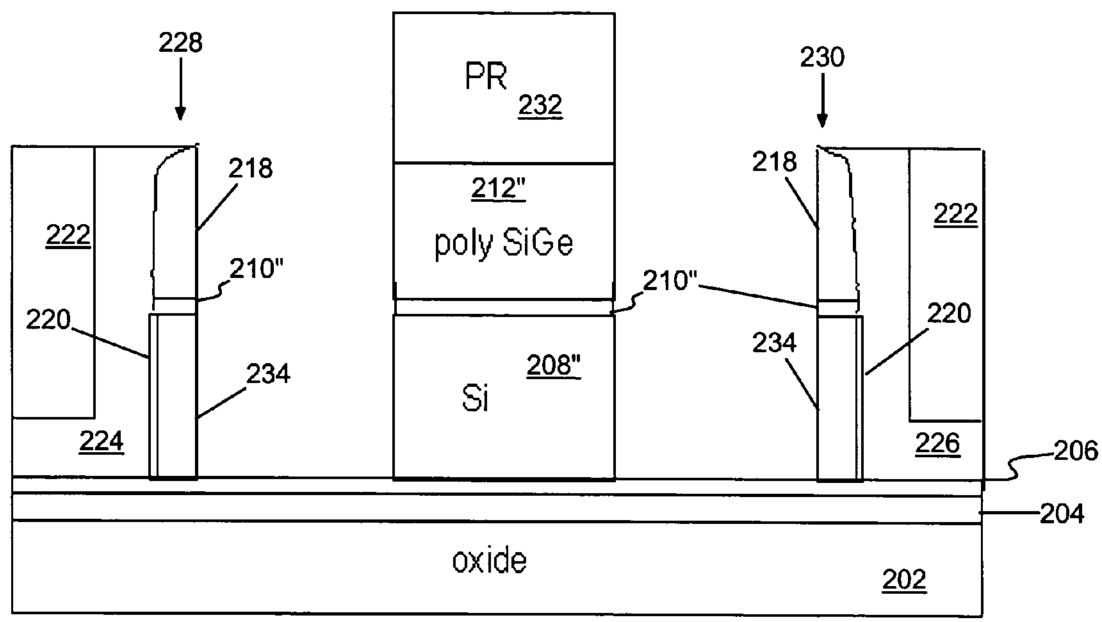
FIGS. 13A–B show an example of fin definition and floating gate formation at the cells.
Figure 13B:
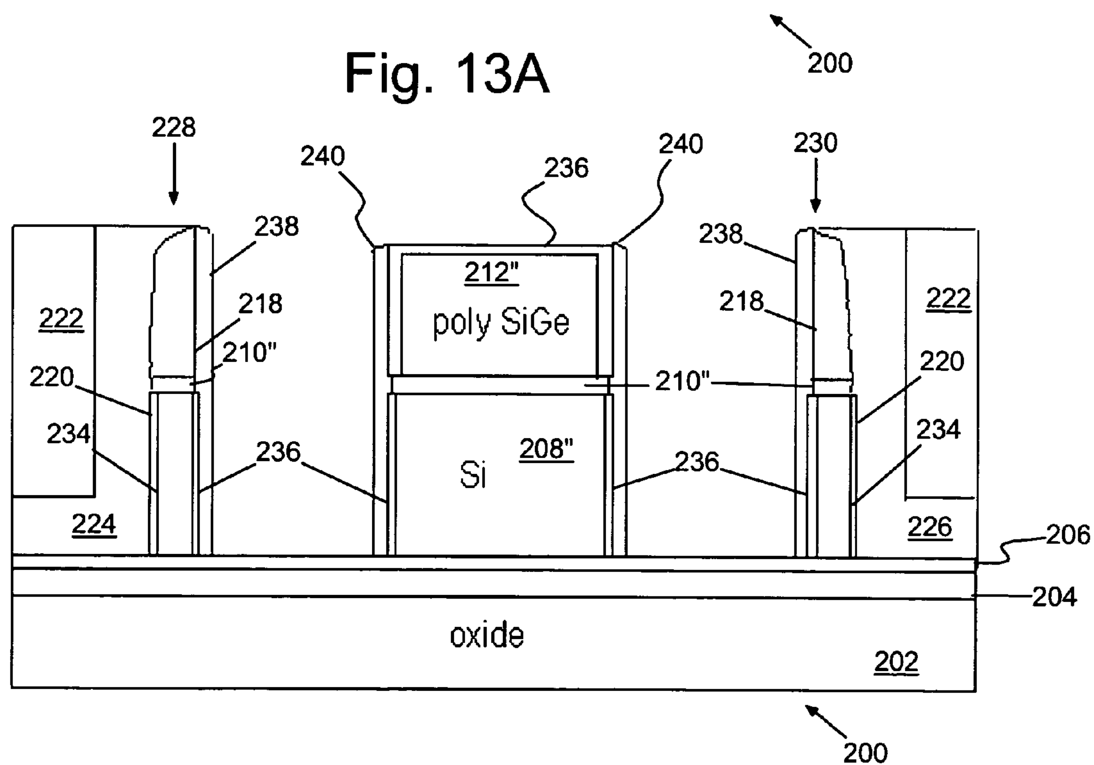

FIGS. 13A–B show an example of fin definition completion and floating gate formation at the cells 228, 230. A photoresist pattern 232 is formed on the wafer 200 and, in particular, over the remaining portions of the sacrificial material layer 212' in FIG. 12B. Fin 234 formation begins by removing the exposed portions of the sacrificial layer 212', e.g., time etching the SiGe with a suitable directional etch selective to Si. Once the sacrificial layer 212" is patterned, the photoresist pattern 232 may be removed, e.g., using a typical etchant. A protective layer (not shown) is formed to protect the upper ends of gates 224, 226, e.g., a thin oxide layer is formed on the exposed ends of gates 224, 226. Then using the patterned sacrificial layer 212" as a mask, the first thin nitride layer 210' and the silicon layer 208' are removed, e.g., using a RIE and stopping at the thin oxide layer 206. Thus, silicon fins 234 have been formed in each cell location 228, 230. Then, a floating gate dielectric (oxide) layer 236 is formed on the exposed side of the silicon fins 234 and, incidentally, also along the remaining portions of the silicon layer 208" and sacrificial layer 212". Preferably, the floating gate oxide 236 is 1–2 nm thick and, in this embodiment, may be thinner than the control gate oxide 224. A conformal floating-gate layer (preferably a 10–20 nm thick polysilicon layer) is formed on the wafer and directionally etched e.g., using RIE. After the directional etch, sidewalls 238, 240 of the floating gate material layer remain along any vertical surface, separated by voids 242; and in particular, floating gate sidewalls 238 have been defined.

Figure 14A:
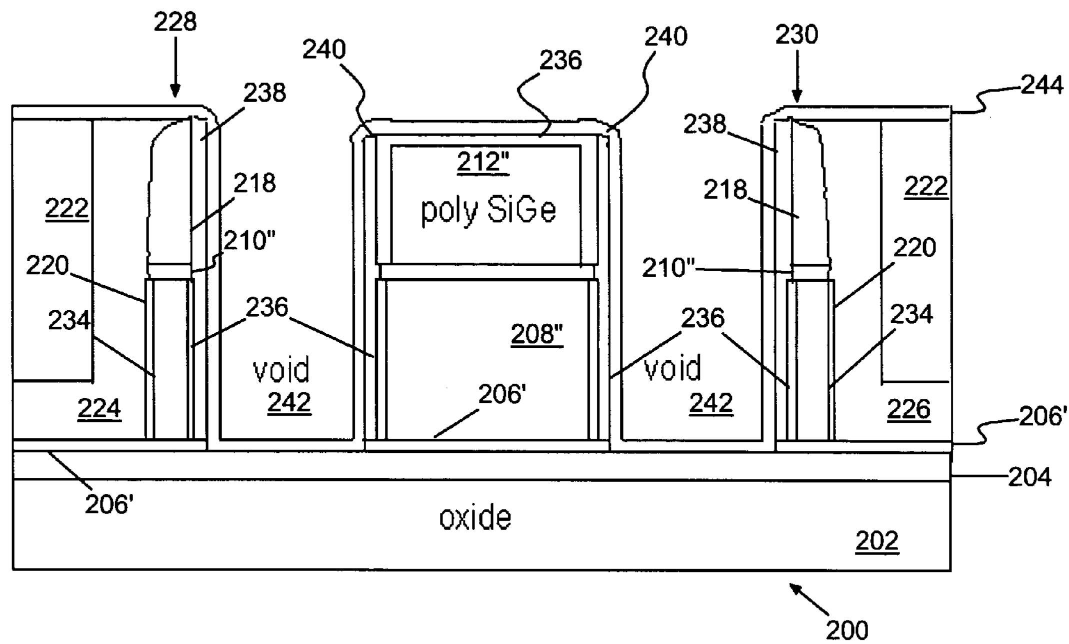
FIGS. 14A–C show forming program gates in voids.
Figure 14B:
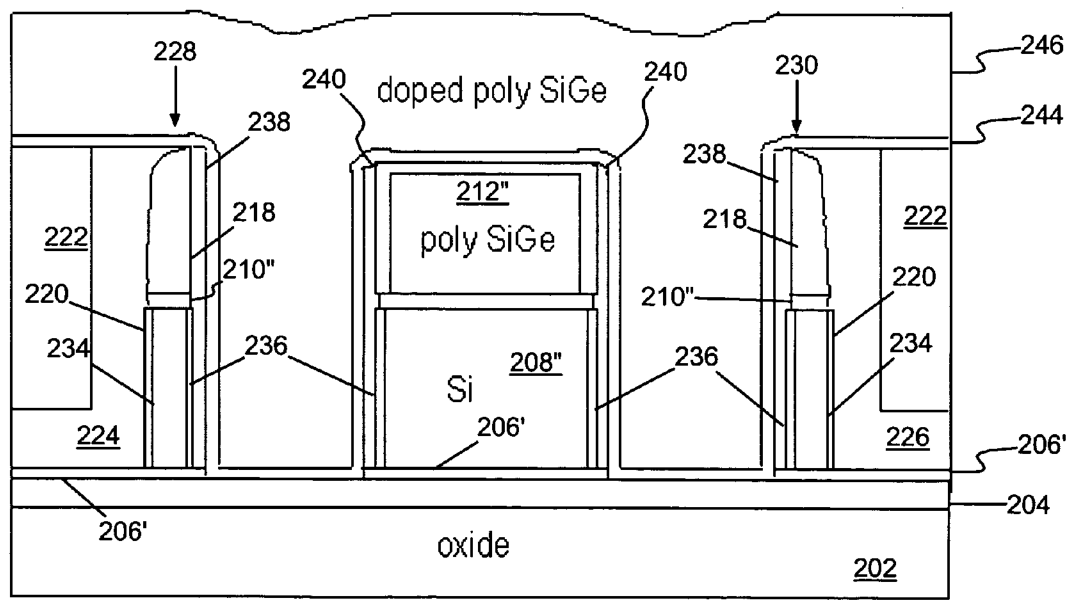
Figure 14C:
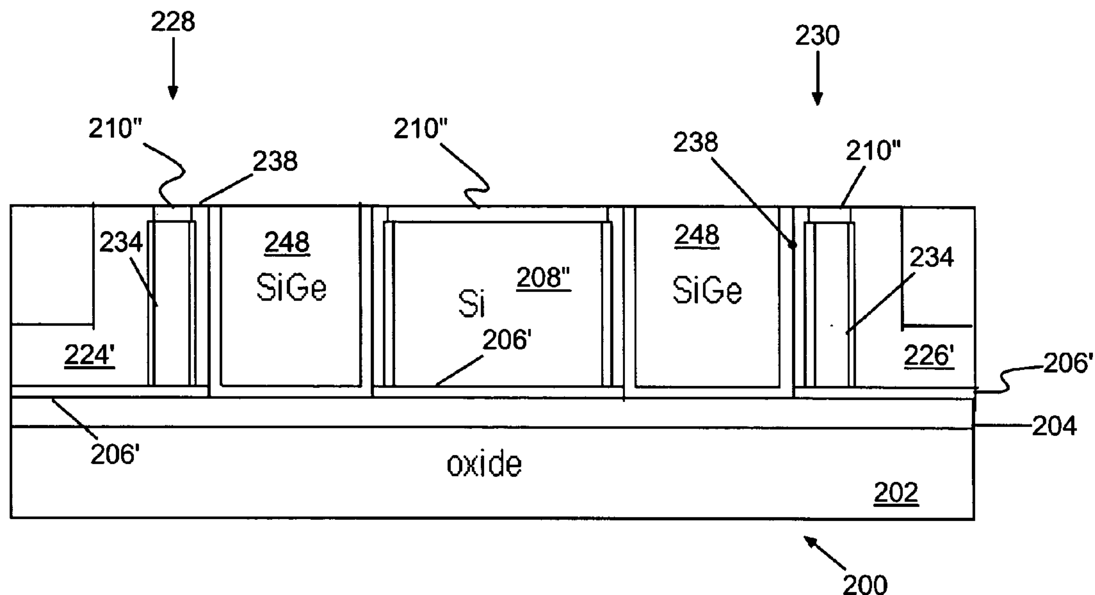

FIGS. 14A–C show forming program gates in step 108 of FIG. 1 for this embodiment. First, exposed areas of oxide layer 206 and any oxide that may remain on the wafer surface is removed, e.g., using a suitable wet etch. After cleaning the surface, portions of the oxide layer 206' remain under cells 228, 230 and remaining sacrificial material 212". Then, a layer 244 of a suitable high K dielectric is conformally deposited on the cleaned surface. A conformal layer of program gate material is deposited on the suitable high K dielectric layer 244. Preferably, the program gate material layer 246 is a thin in situ doped poly-SiGe layer that fills voids 242. Next, the wafer is planarized to the surface of the remaining first nitride layer portions 212". Preferably, the wafer is planarized using a suitable chem-mech polish until partial program gates 248 remain adjacent to each floating gate sidewall 238' and control gate sidewalls 224', 226' remain along the opposite side.

Figure 15A:
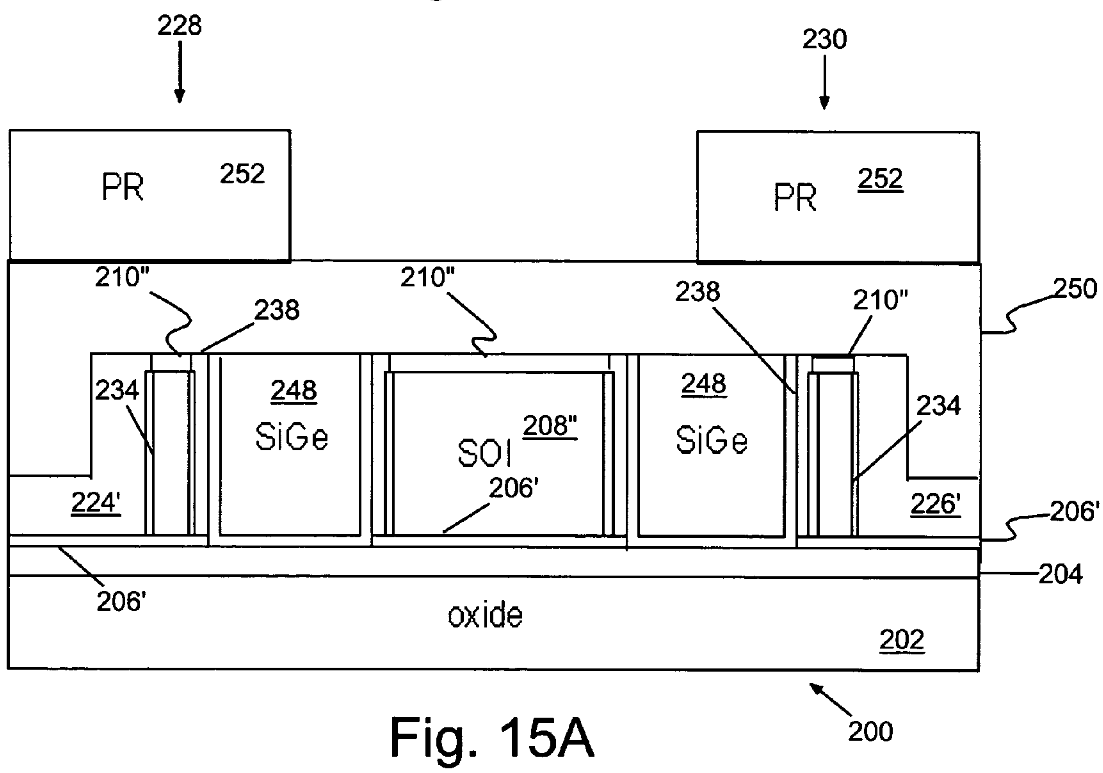
FIGS. 15A–D show an example of cell gate definition for the second preferred embodiment.
Figure 15B:
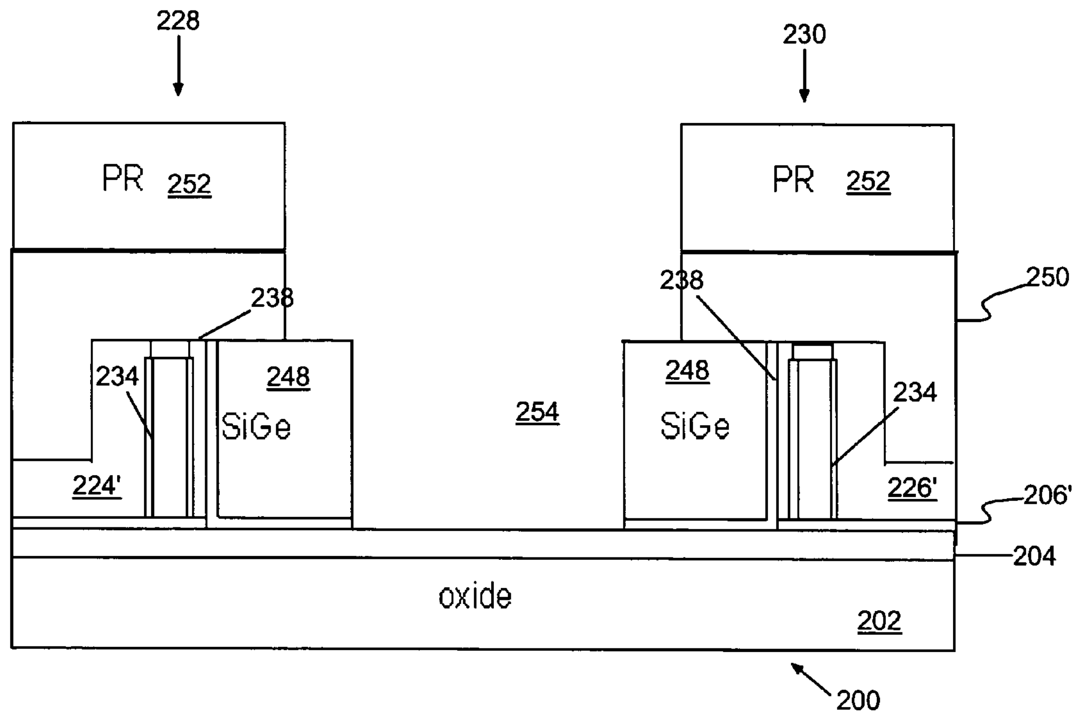
Figure 15C:
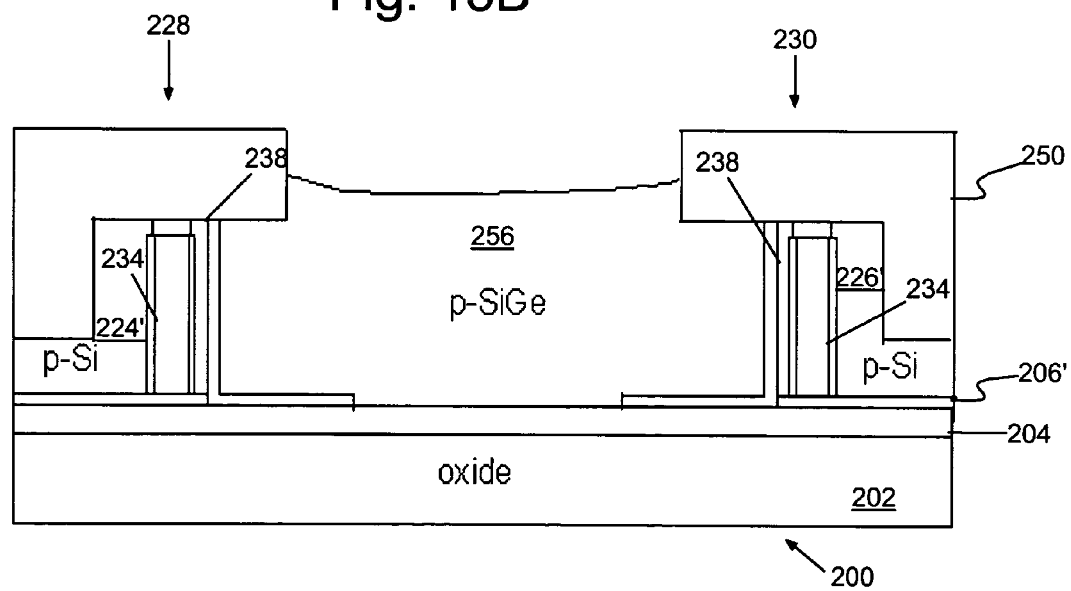
Figure 15D:
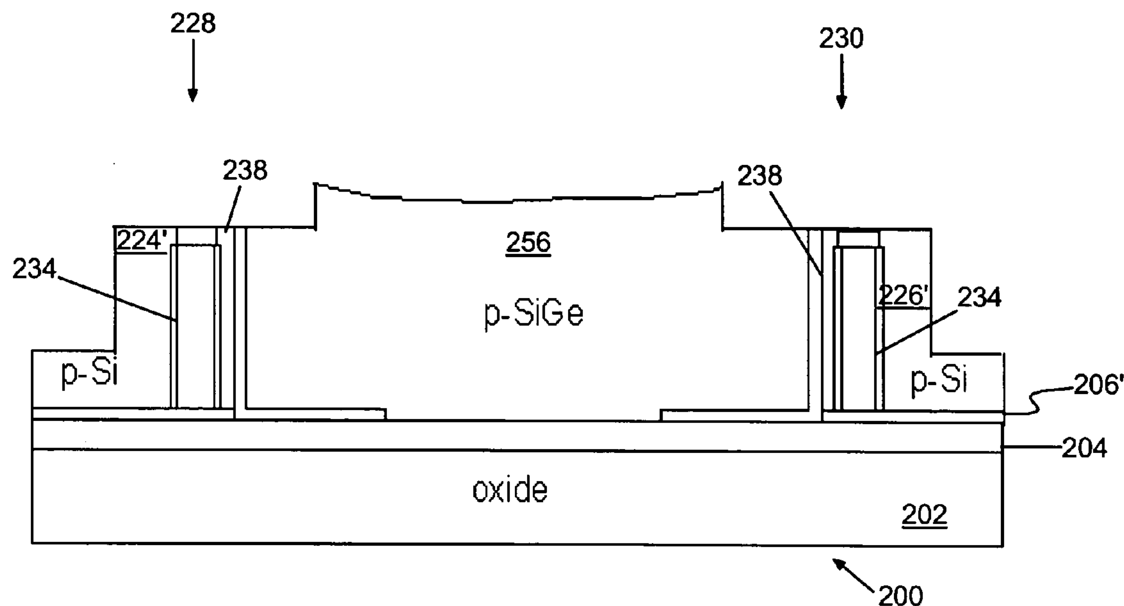

FIGS. 15A–C show an example of cell gate definition in the step 110 of FIG. 1 for the second preferred embodiment. Since exposed upper edges of the floating gate sidewalls 238 may have been damaged in the CMP, any such damage is repaired with a liner oxidation. An additional thickness of fill material (e.g., oxide) is deposited on the surface and planarized to form a surface dielectric layer 250. A photoresist mask 252 is formed on the surface dielectric layer 250 to protect the cells 228, 230 and wafer layers at exposed areas are removed to the thin oxide layer 206. First, exposed portions of surface dielectric layer 250 are removed. Then, e.g., using a RIE that is selective to SiGe and nitride, the remaining portions of the first thin nitride layer 210" are removed to expose remaining excess portions of the silicon layer 208". The exposed silicon layer portions 208" are removed, for example, using an etchant that is selective to SiGe. Removing silicon layer portions 208" exposes the underlying portions of the oxide layer 206", as well as expose the floating gate oxide previously formed along the sides of the removed silicon layer 208". The oxide sidewalls and the exposed oxide layer 206" are removed, e.g., using a wet etch. Removing the oxide sidewalls exposes the high K dielectric sidewalls remaining alongside to the program gates 248. So, for example, a suitable etchant is used to wet etch exposed high K dielectric sidewalls, leaving a void 254 between the partial SiGe program gates 248. The photoresist pattern 252 is removed and a common program gate 256 forms when the void 254 is filled with the same program gate material, e.g., in-situ doped poly SiGe. Any excess program gate material may be etched back, e.g., below the surface oxide layer 250 surface. Finally, as shown in FIG. 16D, e.g., using a wet etch, oxide layer 250 is removed. Once the program gates 256 have been formed, cells may be defined substantially as described for FIGS. 5A–10C.

Figure 16:
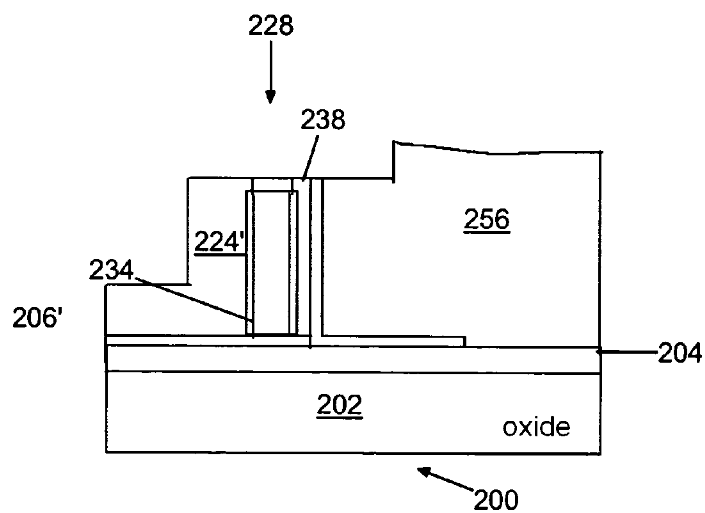
FIG. 16 shows a cross-section of a single cell for the second preferred embodiment.

FIG. 16 shows a cross-section of a single cell 228, analogous to the cell of FIG. 10C. As with the first preferred embodiment, once cell gates (224', 226', 238', 256 in FIG. 15C) are isolated for adjacent cells, source/drain diffusions may be implanted into the silicon fins 234, e.g., with an angled implant through the sides of the fins 234 in exposed areas or, by selectively removing the exposed portions of the nitride cap and implanting the top of fins 234. Also, while individual cells may share source/drain regions (not ahown) with adjacent cells at the same fin 234, optionally, the fins 234 maybe etched to separate adjacent cells. Again, normal MOL and BEOL metallization and passivation may be used (in step 114 of FIG. 1), providing contacts to cells, e.g., at the gates and source/drain regions, and wiring devices together to connect the rows and columns into an array and wiring the array and other circuits to pads and off chip.

It should be noted that the above described device materials are for example only and not intended as a limitation. In particular, the gate material (i.e., control, floating and/or program gate material) may be may be polysilicon, a silicide, SiGe, a metal, any suitable conductive material or any suitable combination thereof. The fins may be silicon, germanium or any other suitable semiconductor material. Further, the gate dielectrics may be an oxide, a high K dielectric or any suitable dielectric material. Also, although insulating layers are described as being an oxide or a nitride, any suitable insulating dielectric may be substituted.

Advantageously, NVRAM FinFET cells formed according to the present invention are much denser than conventional NVRAM cells because the floating gates are vertically located along the sidewall of the fins and so, only increase the area of the NVRAM cell by the thickness of the floating gate. Further, the floating gate back biases the FinFET to independently shift the device threshold, depending upon device type, i.e., whether a n-type FinFET or a p-type FinFET. So, for example, a logic one may be represented by a thresdhold shift from charge stored on the floating gate and a logic zero by an unshifted threshold from the lack of charge or vice versa. Further, with sufficiently sensitive sensing and programming circuits multiple bits may be stored with corresponding multiple shift values.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A nonvolatile storage device comprising:
a semiconductor fin formed on a dielectric surface;
a control gate along one side of said fin;
a floating gate along an opposite side of said fin; and
a program gate adjacent to said floating gate.

2. A nonvolatile storage device as in claim 1, wherein said semiconductor fin selected from a group of materials consisting of silicon, germanium and silicon-germanium.

3. A nonvolatile storage device as in claim 2, wherein said fin is a silicon fin.

4. A nonvolatile storage device as in claim 3, further comprising:
a gate dielectric layer on both of said silicon fin, said control gate and said floating gate being separated from said silicon fin by said gate dielectric layer.

5. A nonvolatile storage device as in claim 4, wherein said gate dielectric layer is an oxide layer.

6. A nonvolatile storage device as in claim 1, wherein said control gate and said floating gate are doped polysilicon.

7. A nonvolatile storage device as in claim 1, wherein said dielectric surface is the surface of a buried oxide layer in a silicon on insulator (SOI) wafer.

8. A nonvolatile storage device comprising:
a semiconductor fin formed on a dielectric surface;
a control gate along one side of said fin;

a floating gate along an opposite side of said fin, wherein said control gate and said floating gate are doped polysilicon; and a program gate adjacent to said floating gate, wherein said program gate is doped silicon germanium (SiGe).

9. A nonvolatile storage device as in claim 8, further comprising a high K dielectric layer separating each of said SiGe program gates from a corresponding said floating gate.

10. A nonvolatile storage device as in claim 8, wherein said semiconductor fin selected from a group of materials consisting of silicon, germanium and silicon-germanium.

11. A nonvolatile storage device as in claim 10, wherein said fin is a silicon fin, said nonvolatile storage device further comprising:

a gate dielectric layer on both sides of said silicon fin, said control gate and said floating gate being separated from said silicon fin by said gate dielectric layer.

12. A nonvolatile storage device as in claim 11, wherein said gate dielectric layer is an oxide layer.

13. A nonvolatile storage device as in claim 8, wherein said dielectric surface is the surface of a buried oxide layer in a silicon on insulator (SOI) wafer.

14. A nonvolatile storage device as in claim 8, wherein said dielectric surface is the surface of an oxide layer disposed on a nitride layer in a bonded silicon on insulator (SOI) wafer.

15. A nonvolatile storage device comprising:

a silicon fin formed on a surface of an oxide layer disposed on a nitride layer in a bonded silicon on insulator (SOI) wafer;

a control gate along one side of said silicon fin;

a floating gate along an opposite side of said silicon fin; and a program gate adjacent to said floating gate.

16. A nonvolatile storage device as in claim 15, further comprising:

a gate dielectric layer on both sides of said silicon fin, said control gate and said floating gate being separated from said silicon fin by said gate dielectric layer.

17. A nonvolatile storage device as in claim 16, wherein said gate dielectric layer is an oxide layer.

18. A nonvolatile storage device as in claim 15, wherein said program gates are doped silicon germanium (SiGe).

19. A nonvolatile storage device as in claim 18, wherein said program gates are doped silicon germanium (SiGe).

20. A nonvolatile storage device as in claim 19, further comprising a high K dielectric layer separating each of said SiGe program gates from a corresponding said floating gate.

* * * * *